(12) United States Patent
Chen et al.

(10) Patent No.: US 12,484,280 B2
(45) Date of Patent: Nov. 25, 2025

(54) SILICIDE-LAYER-COUPLED DOPED PORTION OF ACTIVE REGION AND METHOD OF FABRICATING SAME

(71) Applicant: TAIWAN SEMICONDUCTOR MANUFACTURING COMPANY, LTD., Hsinchu (TW)

(72) Inventors: Chung-Hui Chen, Hsinchu (TW); Tung-Tsun Chen, Hsinchu (TW); Jui-Cheng Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/615,255

(22) Filed: Mar. 25, 2024

(65) Prior Publication Data
US 2024/0234526 A1 Jul. 11, 2024

Related U.S. Application Data

(60) Continuation of application No. 18/155,887, filed on Jan. 18, 2023, now Pat. No. 11,967,621, which is a (Continued)

(51) Int. Cl.
*H10D 64/23* (2025.01)
*H10D 30/01* (2025.01)
(Continued)

(52) U.S. Cl.
CPC ....... *H10D 64/254* (2025.01); *H10D 30/0212* (2025.01); *H10D 64/01* (2025.01);
(Continued)

(58) Field of Classification Search
CPC .. H10D 64/254; H10D 64/251; H10D 64/256; H10D 30/0212; H10D 84/013; H01L 29/4175; H01L 29/665; H01L 29/66045; H01L 29/66409; H01L 29/66446; H01L 29/41725; H01L 29/41766; H01L 29/41758; H01L 21/823418; H01L 21/8256; H01L 21/8206; H01L 21/8213; H01L 21/8252; H01L 21/8258
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| (Continued) | | | |

FOREIGN PATENT DOCUMENTS

| | | | |
|---|---|---|---|
| JP | 2003332352 A | * | 11/2003 |
| JP | 2010171166 | | 8/2010 |
| (Continued) | | | |

*Primary Examiner* — Joseph C. Nicely
(74) *Attorney, Agent, or Firm* — Hauptman Ham, LLP

(57) ABSTRACT

A semiconductor device includes: a first arrangement including first and second silicide layers correspondingly electrically coupled to opposing first and second sides of a doped first portion of an active region; and a second arrangement including a third silicide layer electrically coupled to a first or second side of a doped second portion of the active region.

20 Claims, 24 Drawing Sheets

Related U.S. Application Data division of application No. 17/175,064, filed on Feb. 12, 2021, now Pat. No. 11,563,095.

(60) Provisional application No. 63/031,905, filed on May 29, 2020.

(51) Int. Cl.
  *H10D 64/01* (2025.01)
  *H10D 84/01* (2025.01)
  *H01L 23/34* (2006.01)
  *H10D 30/67* (2025.01)
  *H10D 84/80* (2025.01)

(52) U.S. Cl.
  CPC ......... *H10D 64/251* (2025.01); *H10D 64/256* (2025.01); *H10D 84/013* (2025.01); *H10D 84/0149* (2025.01); *H10D 84/017* (2025.01); *H01L 23/345* (2013.01); *H10D 30/6713* (2025.01); *H10D 84/811* (2025.01)

(56) References Cited

U.S. PATENT DOCUMENTS

| | | | |
|---|---|---|---|
| 2007/0018238 A1* | 1/2007 | Ono | H10D 64/685 257/327 |
| 2008/0054313 A1 | 3/2008 | Dyer et al. | |
| 2009/0001521 A1* | 1/2009 | Yonekawa | H01L 23/544 257/E23.179 |
| 2010/0181547 A1 | 7/2010 | Kuroda | |
| 2012/0199905 A1* | 8/2012 | Nitta | H01L 21/32051 257/E29.256 |
| 2014/0040838 A1 | 2/2014 | Liu et al. | |
| 2015/0221768 A1* | 8/2015 | Zhong | H10D 30/797 438/197 |
| 2015/0278429 A1 | 10/2015 | Chang | |
| 2019/0109200 A1* | 4/2019 | He | H10D 30/6758 |

FOREIGN PATENT DOCUMENTS

| | | |
|---|---|---|
| JP | 2019525478 | 9/2019 |
| KR | 1020190072674 | 6/2019 |
| WO | 2018031175 | 2/2018 |

* cited by examiner

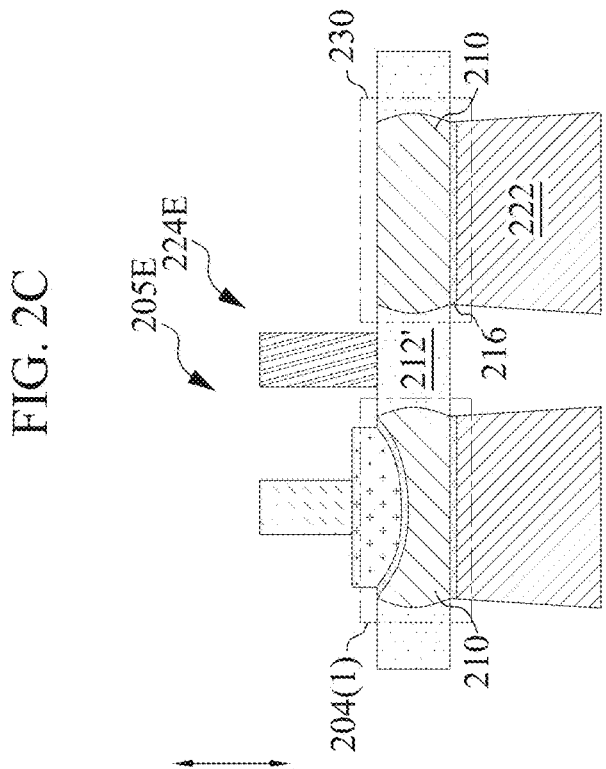
FIG. 2C
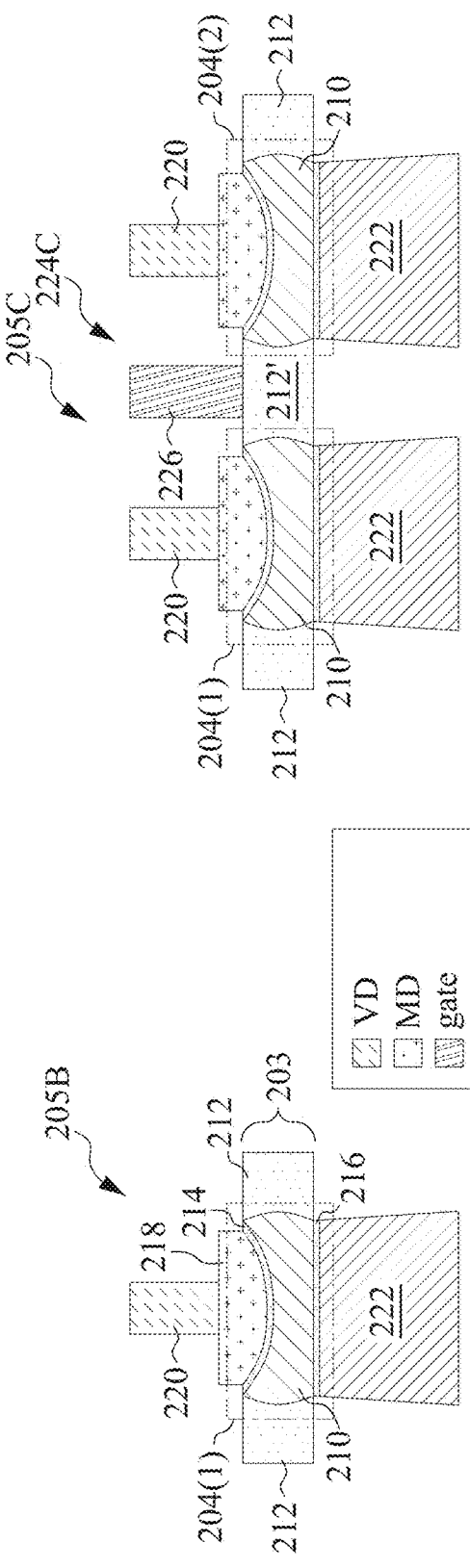
FIG. 2B
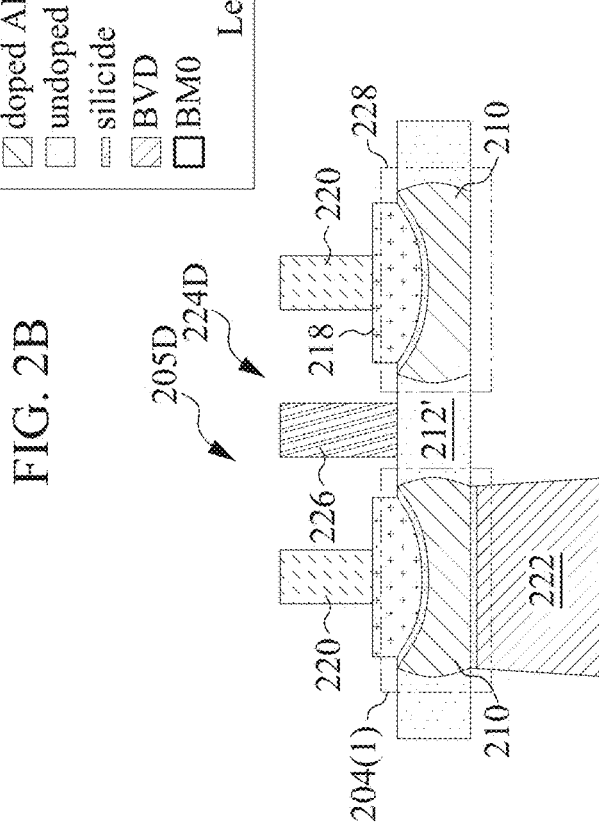
FIG. 2E
FIG. 2D

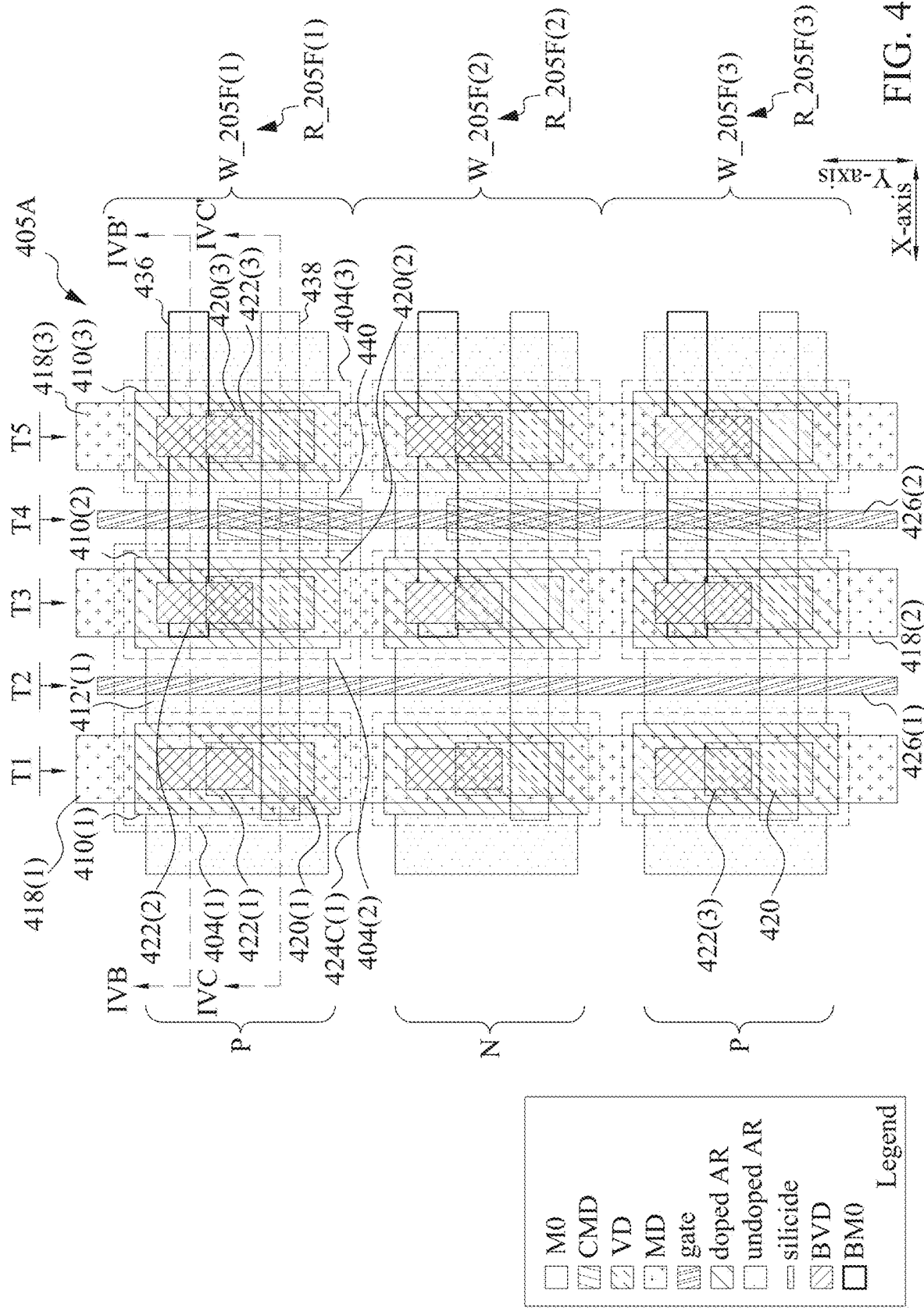

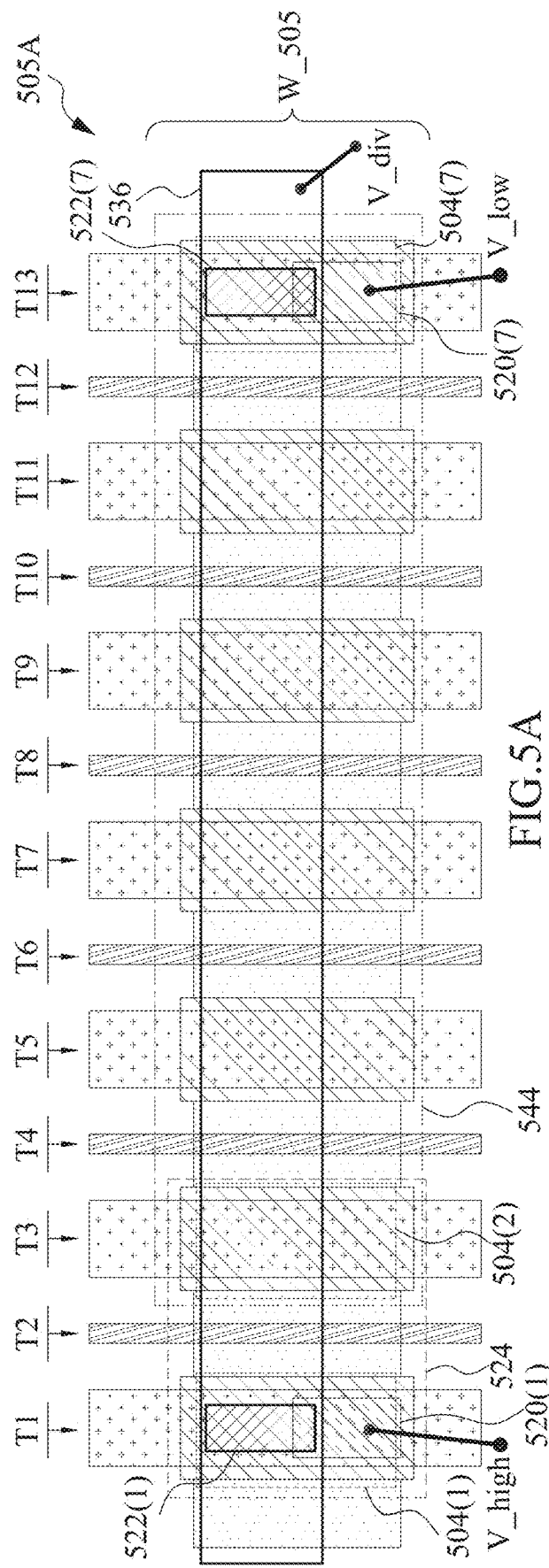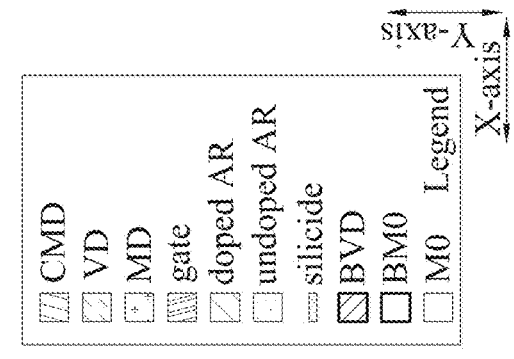
FIG. 5A
FIG. 5B

SILICIDE-LAYER-COUPLED DOPED PORTION OF ACTIVE REGION AND METHOD OF FABRICATING SAME

PRIORITY CLAIM AND CROSS-REFERENCE

The present application is a continuation of U.S. application Ser. No. 18/155,887, filed Jan. 18, 2023, now U.S. Pat. No. 11,967,621, issued Apr. 23, 2024, which is a divisional of U.S. application Ser. No. 17/175,064, filed Feb. 12, 2021, now U.S. Pat. No. 11,563,095, issued Jan. 24, 2023, which claims the priority of U.S. Provisional Application No. 63/031,905, filed May 29, 2020, each of which is incorporated herein by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process/technology node by which will be fabricated a semiconductor device based on a layout diagram. The design rule set compensates for variability of the corresponding process/technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B-2E are corresponding cross-sections, in accordance with some embodiments.

FIG. 4A is a layout diagram, in accordance with some embodiments.

FIG. 5A is a layout diagram, in accordance with some embodiments.

FIG. 5B is a cross-section, in accordance with some embodiments.

DETAILED DESCRIPTION

Figure 1:
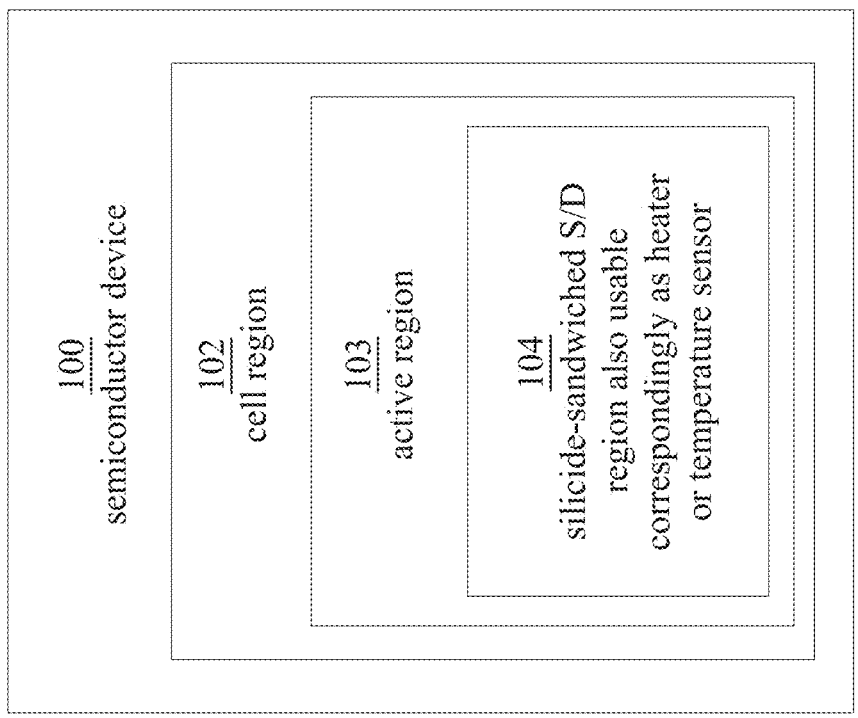
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device, e.g., an active transistor, includes: a first source/drain (S/D) region including a silicide-sandwiched portion of a corresponding active region; a gate structure over a channel portion of the corresponding active region; and a second S/D arrangement including a first doped portion of the corresponding active region wherein the channel portion is between the first doped portion and the silicide-sandwiched portion, and at least one of an upper contact arrangement and a lower contact arrangement. In some embodiments, a silicide-sandwiched portion of the corresponding active region includes: an active region having a first portion which is doped; a first silicide layer over the first doped portion; a first metal-to-drain/source (MD) contact structure over the first silicide layer; a first via-to-MD (VD) structure over the MD contact structure; a second silicide layer under the first doped portion; and a first buried via-to-source/drain (BVD) structure under the second silicide layer. In some embodiments, the silicide-sandwiched S/D region is used as a heater for heating the active transistor. In some embodiments, the silicide-sandwiched S/D region is used as a temperature sensor for sensing a temperature of the active transistor.

According to another approach, an active transistor is formed from an instance of the channel portion between two instances of an upper contact region, with an instance of gate structure overlying the instance of channel portion. Further according to the other approach, a thermistor (also known as a thermal resistor) (not shown) is formed in one of the metallization layers (not shown) overlying the transistor, e.g., in the third metallization layer, with the thermistor being used as a heater for heating the active transistor or as temperature sensor for sensing a temperature of the active transistor. However, according to the other approach, the thermistor is too thermally distant to heat the active transistor effectively and/or efficiently, and is too thermally distant to sense the temperature of the active transistor accurately. In some embodiments in which silicide-sandwiched S/D region is used as a heater for heating the active transistor, the silicide-sandwiched S/D region is sufficiently thermally proximal to active transistor that silicide-sandwiched S/D region more effectively and more efficiently heats active transistor as compared to the effectiveness and efficiency of the other approach. In some embodiments in which silicide-sandwiched S/D region is used as a temperature sensor for sensing a temperature of active transistor, silicide-sandwiched S/D region is sufficiently thermally proximal to active transistor that silicide-sandwiched S/D region more accurately senses the temperature of active transistor as compared to the accuracy of the other approach.

FIG. 1 is a block diagram of a semiconductor device 100, in accordance with some embodiments.

Semiconductor device 100 includes one or more cell regions 102. Each cell region 102 includes one or more active regions 103. Each active region 103 includes one or more silicide-sandwiched source/drain (S/D) regions 104. In addition to being usable as an S/D drain region per se of a corresponding transistor, each silicide-sandwiched S/D region is usable as a heater or as a temperature sensor.

Figure 2A:
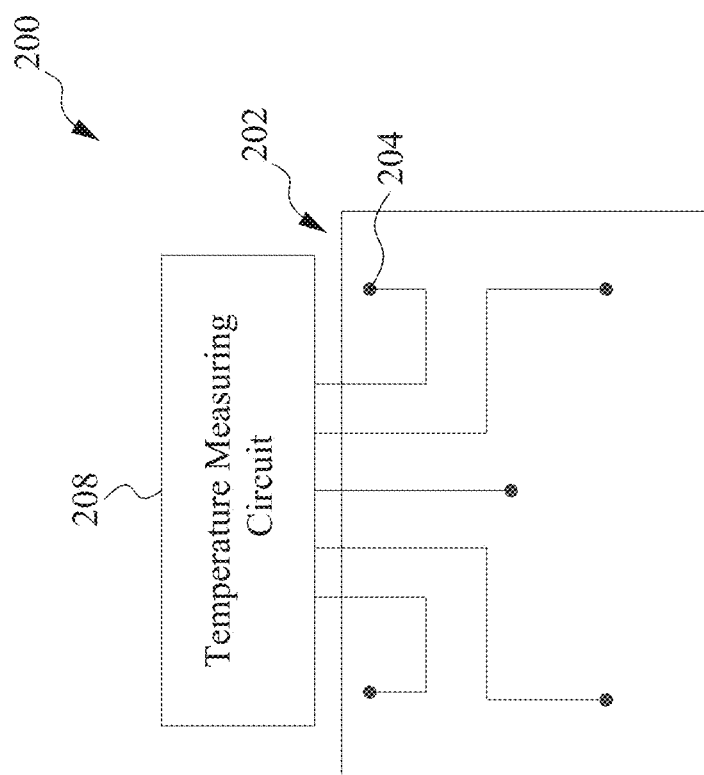
FIG. 2A is a block diagram of a system, in accordance with some embodiments.

FIG. 2A is a block diagram of a temperature monitoring system 200, in accordance with some embodiments.

Temperature monitoring system 200 includes one or more cell regions 202 and a temperature measuring circuit 208 (see FIGS. 4E, 5B, 6A-6E, or the like). Cell region 202 includes silicide-sandwiched source/drain (S/D) regions 204 (not all of which are labeled for ease of illustration) (see FIG. 2B, 2F, or the like). Depending upon the function of cell region 202, each silicide-sandwiched S/D region 204 is used variously and correspondingly used as a heater, or a temperature sensor, or as an S/D drain region per se of a corresponding transistor.

In some embodiments, cell region 202 is an example of semiconductor device 100 of FIG. 1. In some embodiments, temperature monitoring system 200 is an example of semiconductor device 100 of FIG. 1.

FIGS. 2B-2E are corresponding cross-sections of semiconductor structure 205B, active transistor 224C, active transistor 224D and active transistor 224E, in accordance with some embodiments.

In FIG. 2B, semiconductor structure 205B is a source/drain (S/D) region which includes an active region/layer 203 and a silicide-sandwiched source/drain (S/D) region 204(1). Silicide-sandwiched S/D region 204(1) is used variously and correspondingly used as a heater, or a temperature sensor, or as an S/D drain region per se of a corresponding transistor.

Active layer 203 includes portions 210 and 212. Portion 210 of active layer 203 is formed of a first semiconductor material and portions 210 and 212 each are formed of a different second semiconductor material. In some embodiments, a base material for each of the first and second semiconductor materials is silicon. In some embodiments, portion 210 is a more heavily doped semiconductor material and each of portions 212 is a less heavily doped semiconductor material. In some embodiments, portion 210 is a doped semiconductor material and each of portions 212 is an undoped semiconductor material. For ease of discussion, portions 212 will be referred to as undoped portions, and portion 210 will be referred to as a doped portion. In some embodiments, doped portion 210 is based on epitaxially grown silicon. Details regarding epitaxial growth of a portion of an active region are found, e.g., in U.S. Pre-Grant Publication No. 10,510,850, published Dec. 17, 2019, and U.S. Pre-Grant Publication No. 10,700,208, published Jun. 30, 2020, the entireties of each of which are hereby incorporated by reference.

In FIG. 2B, silicide-sandwiched S/D region 204(1) includes: doped portion 210; a top silicide layer 214 over and electrically coupled to doped portion 210; a metal-to-drain/source (MD) contact structure 218 over and electrically coupled to top silicide layer 214; a via-to-MD (VD) structure 220 over and electrically coupled to MD contact structure 218; a bottom silicide layer 216 under and electrically coupled to doped portion 210; and a buried via-to-source/drain (BVD) structure 222 under and electrically coupled to the second silicide layer.

In some embodiments, top silicide layer 214 is formed by a self-aligned type of silicidation process and so is referred to as top salicide layer 214. In some embodiments, bottom silicide layer 216 is formed by a self-aligned type of silicidation process and so is referred to as bottom salicide layer 216. In some embodiments, top silicide layer 214 and/or bottom silicide layer 216 includes titanium, nickel, cobalt, or erbium, or the like, in order to reduce a Schottky barrier height between doped portion 210 and correspondingly MD contact structure 218 and BVD structure 222. In some embodiments, however, other metals, such as platinum, palladium, or the like, are used. In some embodiments, silicidation is performed by blanket deposition of an appropriate metal layer, followed by an annealing step which causes the metal to react with underlying exposed doped portion 210. Un-reacted metal is then removed, such as with a selective etch process. In some embodiments, thicknesses of top silicide layer 214 and/or bottom silicide are correspondingly between about 5 Å and about 2000 Å. Details regarding the formation of silicide layers are found, e.g., in the above-noted U.S. Pre-Grant Publication Nos. 10,510,850 and 10,700,208.

In FIG. 2B, in general, each of MD contact structure 218, top silicide layer 214, doped portion 210 and bottom silicide layer 216 has a corresponding resistance profile that changes with temperature to some extent. As a result, a unit including MD contact structure 218 and silicide-sandwiched S/D region 204(1) has an overall resistance profile. Based on a primary purpose of a particular instance of silicide-sandwiched S/D region 204(1), the overall resistance profile of a unit including MD contact structure 218 and silicide-sandwiched S/D region 204(1) is adjusted accordingly.

In some embodiments in which a primary purpose of silicide-sandwiched S/D region 204(1) is for use as a heater, doped portion 210 is configured to have a resistance that changes relatively little with temperature. In some embodiments in which a primary purpose of silicide-sandwiched S/D region 204(1) is for use as a heater, a unit including MD contact structure 218 and silicide-sandwiched S/D region 204(1) is configured to have an overall resistance that changes relatively little with temperature.

In some embodiments in which a primary purpose of silicide-sandwiched S/D region 204(1) is for use as an S/D region per se, doped portion 210 is configured to have a resistance that changes relatively little with temperature. In some embodiments in which a primary purpose of silicide-sandwiched S/D region 204(1) is for use as an S/D region per se, a unit including MD contact structure 218 and silicide-sandwiched S/D region 204(1) is configured to have an overall resistance that changes relatively little with temperature.

In some embodiments in which silicide-sandwiched S/D region 204(1) is used as a temperature sensor, doped portion 210 is configured to have a resistance that changes significantly, if not substantially, with temperature such that doped portion 210 behaves like a thermistor (also known as a thermal resistor). In some embodiments in which a primary purpose of silicide-sandwiched S/D region 204(1) is for use as a temperature sensor, a unit including MD contact structure 218 and silicide-sandwiched S/D region 204(1) is configured to have an overall resistance that changes significantly, if not substantially, with temperature. In some embodiments in which silicide-sandwiched S/D region 204(1) is used as a temperature sensor, doped portion 210 is configured as a thermistor. In some embodiments in which a primary purpose of silicide-sandwiched S/D region 204(1) is for use as a temperature sensor, doped portion 210 and one or more of MD contact structure 218, top silicide layer 214 or bottom silicide layer 216 is configured as a thermistor. In some embodiments, the thermistor has a temperature coefficient (TcR) which is positive. In some embodiments, the thermistor has a TcR which is negative.

In FIG. 2C, semiconductor device 205C includes: silicide-sandwiched S/D region 204(1); silicide-sandwiched S/D region 204(2); and undoped portion 212'; and a gate structure 226. It is noted that undoped portion 212' is located between silicide-sandwiched S/D regions 204(1) and 204(2) and underneath gate structure 226. Together, silicide-sandwiched S/D regions 204(1) and 204(2), and undoped portion 212' and a gate structure 226 are an active transistor 224C.

Gate structure 226 is configured to selectively induce a channel in undoped portion 212'. Hence, undoped portion 212 is a type of undoped portion referred to herein as a channel portion. Gate structure 226 is referred to herein as being field-coupled to channel portion 212'. In some embodiments, one or more insulating layers (not shown) are formed between gate structure 226 and channel portion 212'.

In FIG. 2C, each of silicide-sandwiched S/D regions 204(1) and 204(2) is used an S/D drain region per se of active transistor 224C. But each of silicide-sandwiched S/D regions 204(1) and 204(2) also is usable variously and correspondingly as a heater or a temperature sensor.

In some embodiments in which each of silicide-sandwiched S/D regions 204(1) and 204(2) is used as an S/D region per se, one of VD structure 220 and BVD structure 222 in silicide-sandwiched S/D region 204(1) is coupled so as to facilitate the flow of current while the other is left floating so as to substantially restrict the flow of current, and one of VD structure 220 and BVD structure 222 in silicide-sandwiched S/D region 204(2) is coupled so as to facilitate the flow of current while the other is left floating so as to substantially restrict the flow of current.

In FIG. 2D, semiconductor device 205D includes silicide-sandwiched S/D region 204(1) and an upper contact region 228. Relative to FIG. 2C, silicide-sandwiched S/D region 204(2) of semiconductor device 205C has been replaced in semiconductor device 205D of FIG. 2D by upper contact region 228. Together, silicide-sandwiched S/D region 204(1), upper contact region 228, undoped portion 212' and a gate structure 226 are an active transistor 224D.

Upper contact region 228 includes: doped portion 210; top silicide layer 214; MD contact structure 218; and VD structure 220. Upper contact region 228 differs from silicide-sandwiched region 204(2) by not including bottom silicide layer 216 nor BVD structure 222.

In FIG. 2D, silicide-sandwiched S/D region 204(1) is used an S/D drain region per se of active transistor 224D. But silicide-sandwiched S/D region 204(1) also is useable variously as a heater or a temperature sensor.

In some embodiments in which silicide-sandwiched S/D region 204(1) is used as a heater, doped portion 210 in silicide-sandwiched S/D region 204(1) is configured with a resistance that is significantly different than the resistance of doped portion 210 in upper contact region 228.

According to another approach, an active transistor is formed from an instance of channel portion 212' between two instances of upper contact region 228 with an instance of gate structure 226 overlying the instance of channel portion 212'. Further according to the other approach, a thermistor (also known as a thermal resistor) (not shown) is formed in one of the metallization layers (not shown) overlying the transistor, e.g., in the third metallization layer (a distance greater than about 2-3 μm), with the thermistor being used as a heater for heating the active transistor or as temperature sensor for sensing a temperature of the active transistor. However, according to the other approach, the thermistor is too thermally distant to heat the active transistor effectively and/or efficiently, and is too thermally distant to sense the temperature of the active transistor accurately. In some embodiments in which silicide-sandwiched S/D region 204(1) is used as a heater for heating active transistor 224D, silicide-sandwiched S/D region 204(1) is sufficiently thermally proximal to active transistor 224D that silicide-sandwiched S/D region 204(1) more effectively and more efficiently heats active transistor 224D as compared to the effectiveness and efficiency of the other approach. In some embodiments in which silicide-sandwiched S/D region 204(1) is used as a heater for heating active transistor 224D, silicide-sandwiched S/D region 204(1) is sufficiently thermally proximal to active transistor 224D that silicide-sandwiched S/D region 204(1) heats active transistor 224D is about 10× more efficient to about $10^5$ more efficient as compared to the efficiency of the other approach. In some embodiments in which silicide-sandwiched S/D region 204(1) is used as a temperature sensor for sensing a temperature of active transistor 224D, silicide-sandwiched S/D region 204(1) is sufficiently thermally proximal to active transistor 224D that silicide-sandwiched S/D region 204(1) more accurately senses the temperature of active transistor 224D as compared to the accuracy of the other approach.

In FIG. 2E, semiconductor device 205E includes silicide-sandwiched S/D region 204(1) and a lower contact region 230. Relative to FIG. 2C, silicide-sandwiched S/D region 204(2) of semiconductor device 205C has been replaced in semiconductor device 205E of FIG. 2E by lower contact region 230. Together, silicide-sandwiched S/D region 204(1), lower contact region 230, undoped portion 212' and a gate structure 226 are an active transistor 224E.

Lower contact region 230 includes: doped portion 210; bottom silicide layer 216; and BVD structure 222. Lower contact region 230 differs from silicide-sandwiched region 204(2) by not including top silicide layer 214, MD contact structure 218, nor VD structure 220.

In FIG. 2E, silicide-sandwiched S/D region 204(1) is used an S/D drain region per se of active transistor 224E. But silicide-sandwiched S/D region 204(1) also is useable variously as a heater or a temperature sensor. In some embodiments in which silicide-sandwiched S/D region 204(1) is used as a heater, doped portion 210 in silicide-sandwiched S/D region 204(1) is configured with a resistance that is significantly different than the resistance of doped portion 210 in lower contact region 230.

Figure 2F:
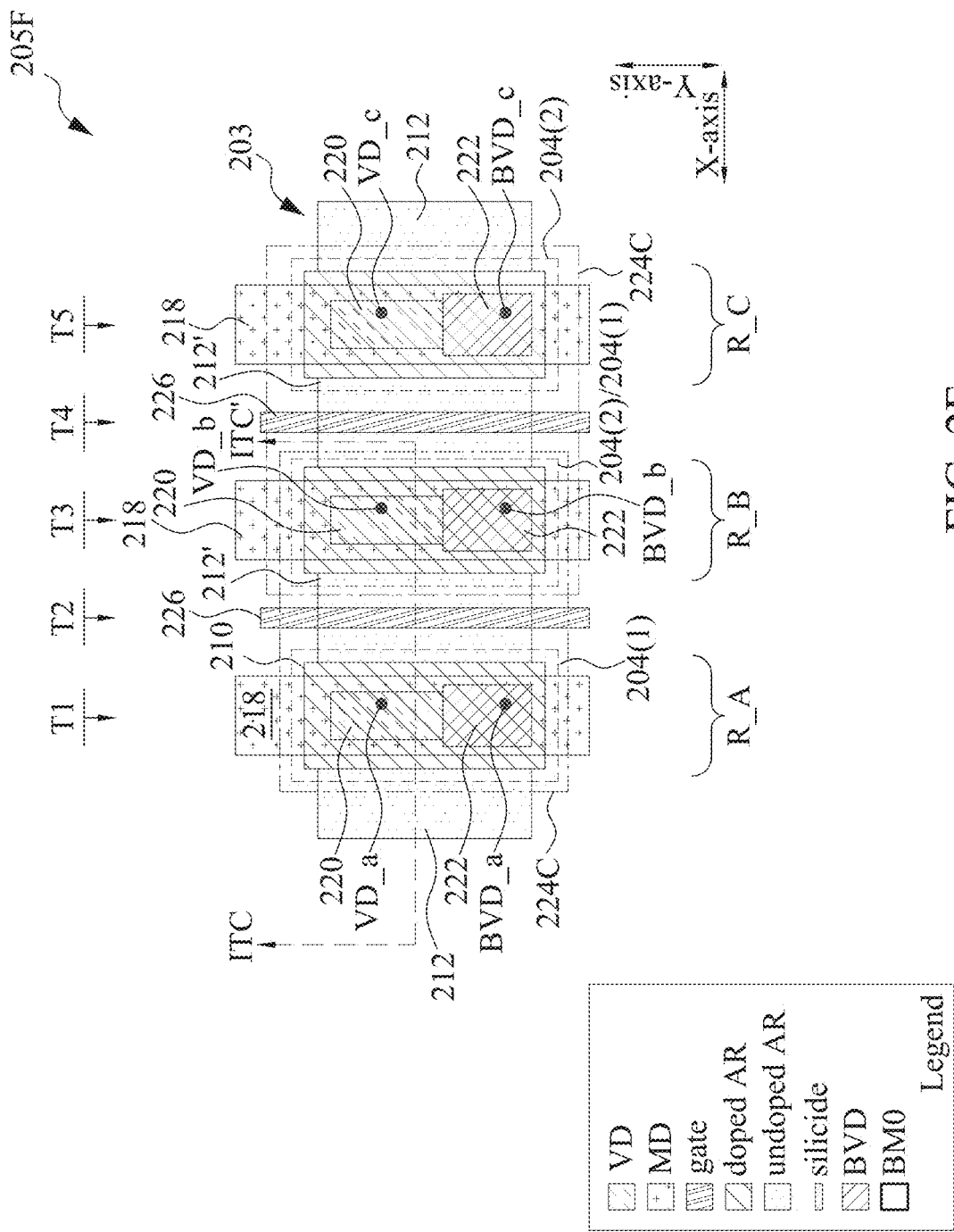
FIG. 2F is a layout diagram, in accordance with some embodiments.

FIG. 2F is a layout diagram 205F, in accordance with some embodiments.

Layout diagram 205F is representative of a semiconductor device. More particularly, layout diagram 205F is representative of two instances of active transistor 224C of FIG. 2C which are formed side by side, as reflected by the middle silicide-sandwiched S/D region being numbered 204(2)/204(1). Cross-section line IIC-IIC' in FIG. 2F shows how FIG. 2F relates to FIG. 2C.

As such, individual shapes (also known as patterns) in layout diagram 205F are representative of individual structures in the semiconductor device represented by layout diagram 205F. For simplicity of discussion, elements in layout diagram 205F (and in other layout diagrams included herein) will be referred to as if they are structures rather than shapes per se. For example, each instance of shape 226 in layout diagram 205F is a gate shape which represents an instance of gate structure 226 of FIG. 2C. In the following discussion, each instance of element 226 in layout diagram 205F is referred to as gate structure 226 rather than as gate shape 226. For example, each instance of element 210 in layout diagram 205F is a doped shape which is designated for doping and which represents an instance of doped portion 210 of FIG. 2C. In the following discussion, each instance of element 210 of layout diagram 205F is referred to as doped portion 210 rather than as doped shape 210.

Layout diagram 205F is organized according to track lines T1, T2, T3, T4 and T5 which are parallel to a first direction, the first direction being in the direction of the Y-axis in FIG. 2F. Instances of undoped portions 212, doped portions 210 and channel portions 212' are grouped in a set which represents an active region, the active region having a long axis of symmetry which extends in a second direction substantially perpendicular to the first direction, the second direction being the X-axis in FIG. 2F. In some embodiments, the first and second directions are perpendicular directions other than the corresponding directions of the Y-axis and the X-axis.

Relative to the X-axis, instances of gate structure 226 and MD contact structure 218 are interspersed and non-overlapping of each other. Long axes of symmetry of silicide-sandwiched S/D regions 204(1), 204(2)/204(1) and 204(2) are substantially aligned with corresponding tracks T1, T3 and T5. A long axis of symmetry of a first instance of gate structure 226 is substantially aligned with track T2. A long axis of symmetry of a second instance of gate structure 226 is substantially aligned with track T4. In some embodiments, T1-aligned silicide-sandwiched S/D region 204(1) is configured for use as a heater, T3-aligned silicide-sandwiched S/D region 204(2)/204(1) is configured for use as a thermal sensor, e.g., a thermistor, and T5-aligned silicide-sandwiched S/D region 204(2) is configured for use as a heater.

In some embodiments, relative to the X-axis, adjacent track lines are separated by one-half a unit of contacted poly pitch (CPP). Typically, the unit of CPP is specific to a corresponding process node by which will be fabricated a semiconductor device based on a corresponding layout diagram. For example, track lines T3 and T4 are separated by CPP/2, and track lines T3 and T5 are separated by 1*CPP.

Instances of MD contact structure 218 are aligned with corresponding tracks T1, T3 and T5 and are over corresponding instances of doped portion 210. Instances of top silicide layer 214 corresponding to the instances of doped portion 210 are correspondingly aligned with tracks T1, T3 and T5, but are not shown in FIG. 2F (or in other layout diagrams disclosed herein) for simplicity of illustration. Instances of VD structure 220 are aligned with corresponding tracks T1, T3 and T5 and are over corresponding instances of MD contact structure 218. Instances of BVD structure 222 are aligned with corresponding tracks T1, T3 and T5 and are under corresponding instances of doped portion 210. Instances of bottom silicide layer 216 corresponding to the instances of doped portion 210 are correspondingly aligned with tracks T1, T3 and T5, but are not shown in FIG. 2F (or in other layout diagrams disclosed herein) for simplicity of illustration.

Figure 2G:
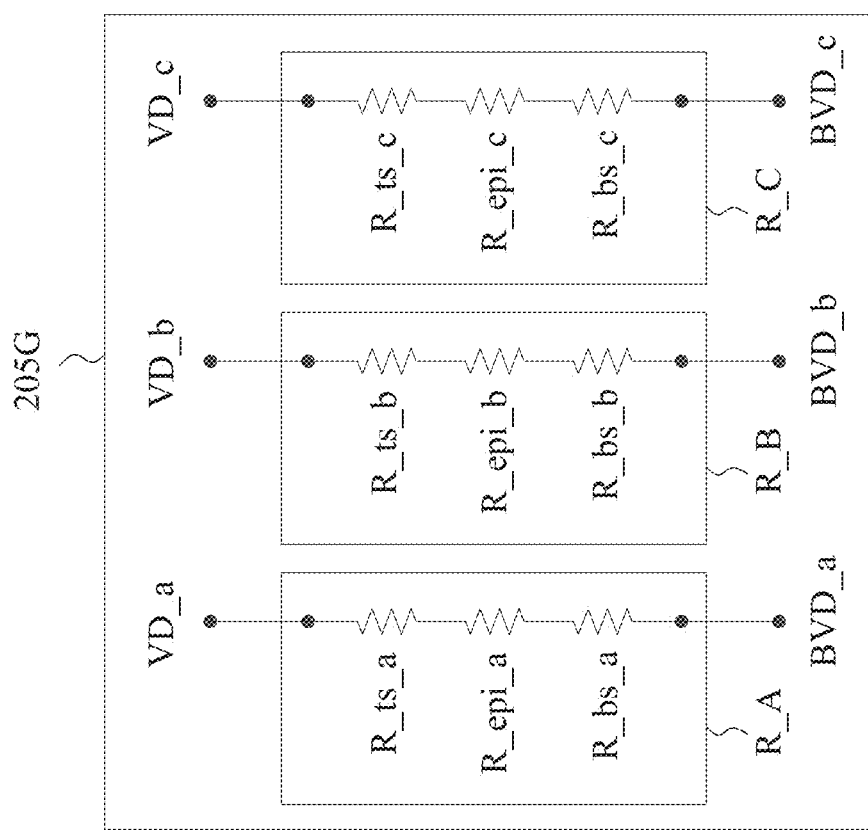
FIG. 2G is a circuit diagram, in accordance with some embodiments.

FIG. 2G is a circuit diagram 205G representing FIG. 2F, in accordance with some embodiments.

In circuit diagram 205G, silicide-sandwiched S/D regions 204(1), 204(2)/204(1) and 204(2) are correspondingly represented by resistors R_A, R_B and R_C. In more detail, a voltage VD_a on the T1-aligned instance of VD structure 220 is coupled to a voltage BVD_a on the T1-aligned instance of BVD structure 222 through resistor R_A. A voltage VD_b on the T3-aligned instance of VD structure 220 is coupled to a voltage BVD_b on the T3-aligned instance of BVD structure 222 through resistor R_B. And a voltage VD_c on the T5-aligned instance of VD structure 220 is coupled to a voltage BVD_c on the T5-aligned instance of BVD structure 222 through resistor R_C.

Resistor R_A is a series connection of a resistance R_ts_a of the T1-aligned instance of top silicide layer 214 (not shown in FIG. 2F but see FIG. 2B), a resistance R_epi_a of the T1-aligned instance doped portion 210, and a resistance R_Bs_a of the T1-aligned instance of bottom silicide layer 216 (not shown in FIG. 2F but see FIG. 2B). Resistor R_B is a series connection of a resistance R_ts_b of the T3-aligned instance of top silicide layer 214 (not shown in FIG. 2F but see FIG. 2B), a resistance R_epi_b of the T3-aligned instance of doped portion 210, and a resistance R_Bs_b of the T3-aligned instance of bottom silicide layer 216 (not shown in FIG. 2F but see FIG. 2B). Resistor R_C is a series connection of a resistance R_ts_c of the T5-aligned instance of top silicide layer 214 (not shown in FIG. 2F but see FIG. 2B), a resistance R_epi_c of the T5-aligned instance doped portion 210, and a resistance R_Bs_c of the T5-aligned instance of bottom silicide layer 216 (not shown in FIG. 2F but see FIG. 2B).

Figure 3A:
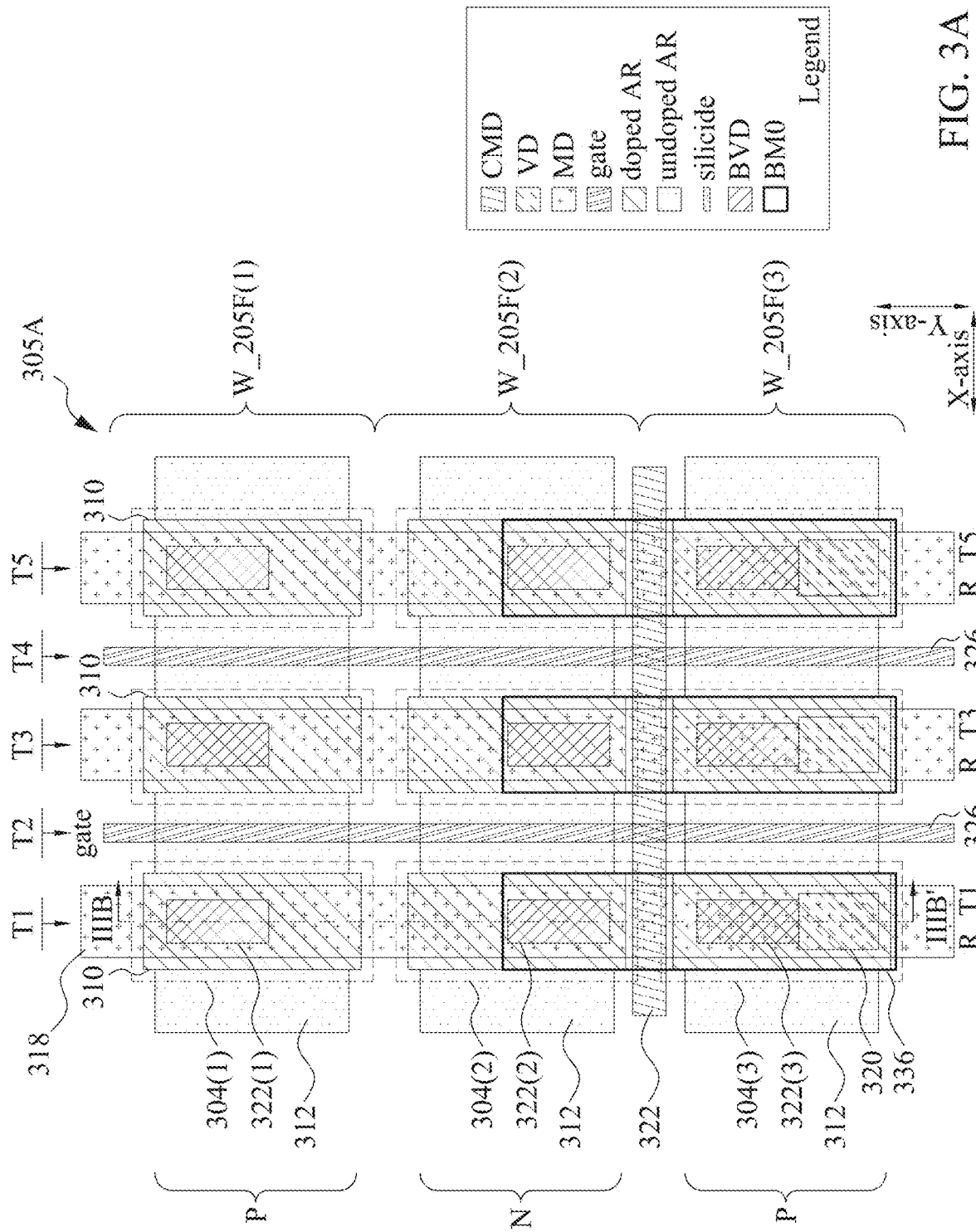
FIG. 3A is a layout diagram, in accordance with some embodiments.
Figure 3B:
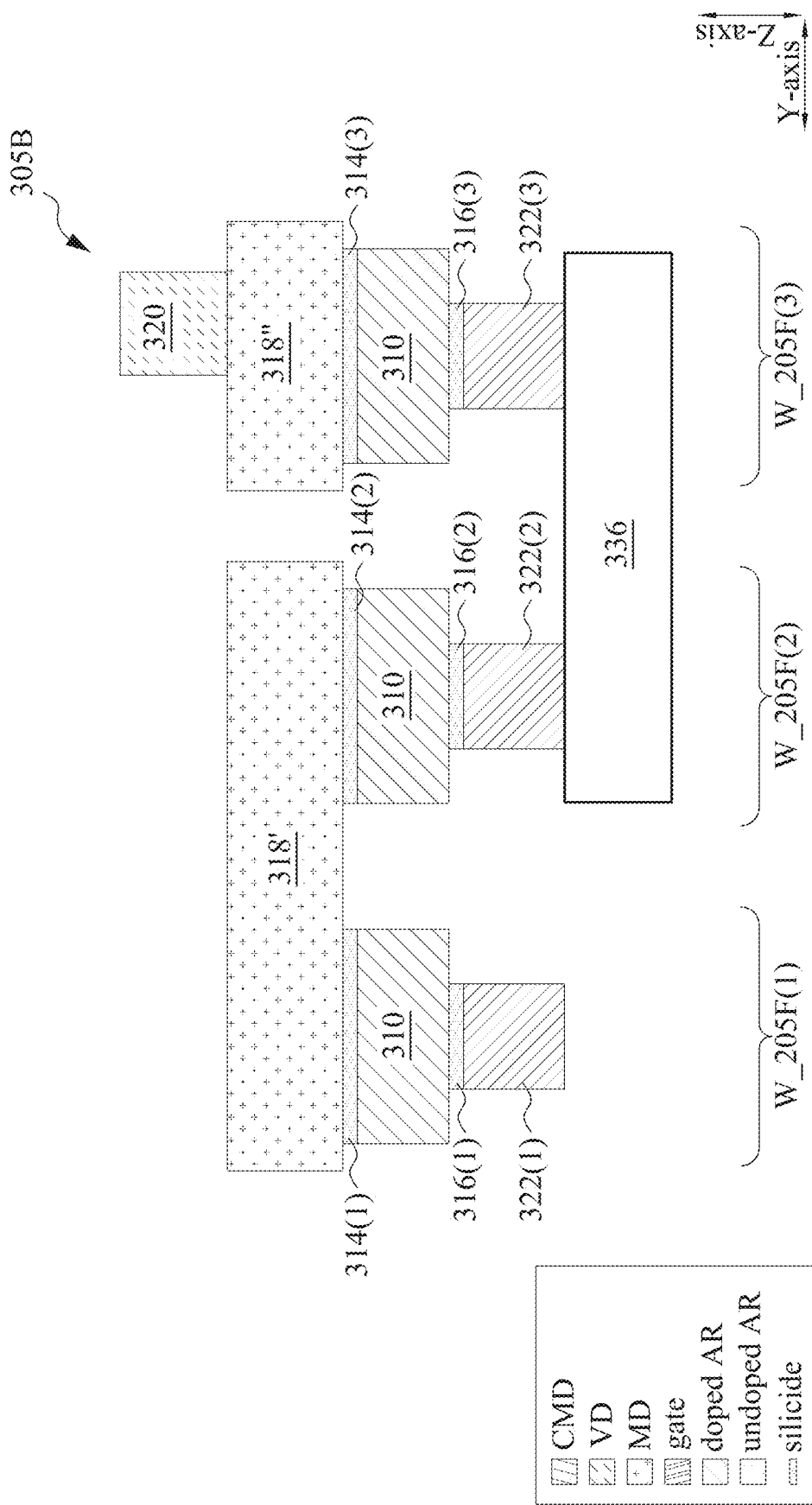
FIG. 3B is a cross-section, in accordance with some embodiments.
Figure 3C:
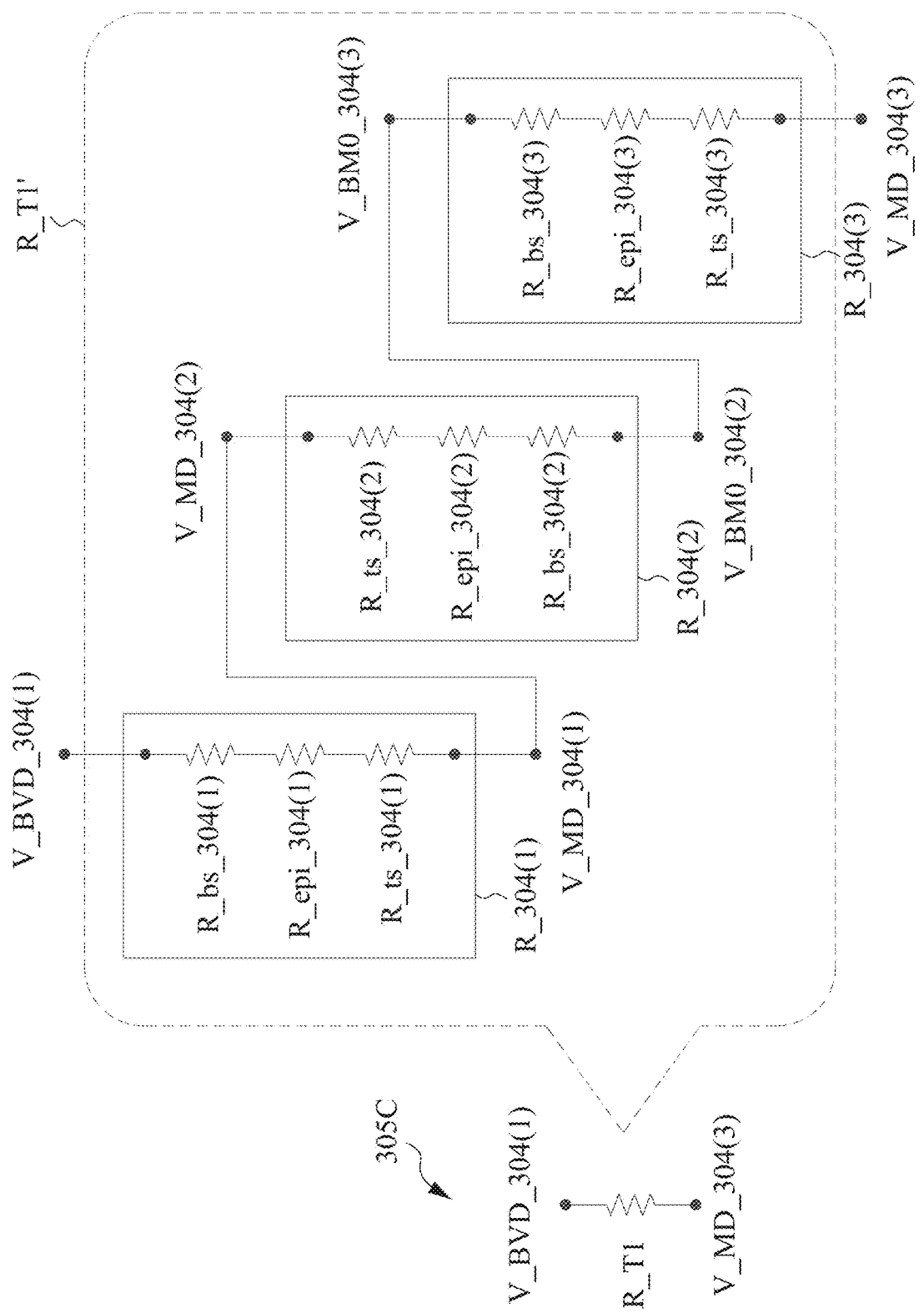
FIG. 3C is a circuit diagram, in accordance with some embodiments.

FIG. 3A is a layout diagram 305A, in accordance with some embodiments. FIG. 3B is a cross-section 305B of a semiconductor device, in accordance with some embodiments. FIG. 3C is a circuit diagram 305C representing FIG. 3B, in accordance with some embodiments.

FIGS. 3A-3C follow a similar numbering scheme to that of FIGS. 2A-2E. Though corresponding, some components also differ. To help identify components which correspond but nevertheless have differences, the numbering convention uses 3-series numbers for FIGS. 3A-3C while the numbering convention for FIGS. 2A-2E uses 2-series numbers. For example, item 304(1) in row W_205F(1) of FIG. 3A is a silicide-sandwiched region and corresponding T1-aligned item 204(1) in FIG. 2F is a silicide-sandwiched region, and wherein: similarities are reflected in the common root_04 (1); and differences are reflected in the corresponding leading digit 3 in FIG. 3A and 2 in FIG. 2F. Also, for example: 310 is a doped portion; R_bs_304(1), R_bs_304(2) and R_bs_304(3) are corresponding resistances; R_epi_304(1), R_epi_304(2) and R_epi_304(3) are corresponding resistances; and R_ts_304(1), R_ts_304(2) and R_ts_304(3) are corresponding resistances; 314(1)-314(3) are corresponding top silicide layers; 316(1)-314(3) are corresponding bottom silicide layers; 322(2)-322(3) are corresponding BVD structures; and 326 is a gate structure. For brevity, the discussion will focus more on differences between FIGS. 3A-3C and FIGS. 2A-2E than on similarities.

The semiconductor device represented by cross-section 305B is an example of a semiconductor device based on layout diagram 305A. Conversely, layout diagram 305A is representative of cross-section 305B. Cross-section line IIIB-IIIB' in FIG. 3A shows how FIG. 3B relates to FIG. 3A. As such, individual shapes (also known as patterns) in layout diagram 305A are representative of individual structures in cross-section 305B. For simplicity of discussion, elements in layout diagram 305A (and, again, in other layout diagrams included herein) will be referred to as if they are structures rather than shapes per se. For simplicity of illustration, not all of elements in layout diagram 305A are labeled with item numbers.

Layout diagram 305A is arranged into three rows W_205F(1), W_205F(2) and W_205F(3) which extend in the direction of the X-axis. Each of rows W_205F(1), W_205F(2) and Wa-205F(3) is a version of layout diagram 205F of FIG. 2F. In FIG. 3A, the active regions corresponding to rows W_205F(1) and W_205F(3) are configured for P-type conductivity, e.g., PMOS transistors, and the active region corresponding to row W_205F(2) is configured for N-type conductivity, e.g., NMOS transistors. In some embodiments, the active regions corresponding to rows W_205F(1) and W_205F(3) are configured for N-type conductivity, and the active region corresponding to row W_205F(2) is configured for P-type conductivity.

In FIG. 3A, T1-aligned MD contact structure 318 extends in the direction of the Y-axis from silicide-sandwiched region 304(1) of row W_205F(1) through silicide-sandwiched region 304(2) of row W_205F(2), and further through silicide-sandwiched region 304(3) of row W_205F (3), which is an example of why each of rows W_205F(1), W_205F(2) and W_205F(3) is referred to as a version of layout diagram 205F of FIG. 2F. As another example, T2-aligned gate structure 326(1) extends in the direction of the Y-axis from silicide-sandwiched region 304(1) of row W_205F(1) through silicide-sandwiched region 304(2) of row W_205F(2), and further through silicide-sandwiched region 304(3) of row W_205F(3). As another example, in contrast to layout diagram 205F of FIG. 2F, instances of VD structure 220 are omitted from each of rows W_205F(1) and W_205F(2). In some embodiments, VD structure 220 are included in row W_205F(1) and/or row W_205F(2).

In FIG. 3A, layout diagram 305A further includes a cut-MD (CMD) shape 332 which indicates that instances of MD contact structure 318 are to be cut into two parts, with the two parts corresponding to MD contact structures 318' and 318" in FIG. 3B.

In FIG. 3A, again, rows W_205F(1), W_205F(2) and W_205(3) extend in the direction of the X-axis. Regarding FIG. 3B, rows W_205F(1), W_205F(2) and W_205(3) extend in the direction of the Z-axis (not shown in FIG. 3B).

Again, FIG. 3C is a circuit diagram 305C representing FIG. 3B. FIG. 3C also is a circuit diagram representing the T1-aligned components of FIG. 3A.

In circuit diagram 305C, silicide-sandwiched S/D regions 304(1), 304(2) and 304(3) are correspondingly represented by resistor R_T1. In some embodiments, R_T1 is configured as a heater, R_T3 is configured as a thermal sensor, e.g., a thermistor, and R_T5 is configured as a heater.

Through resistor R_T1, a voltage V_BVD_304(1) on row-W_205F(1)-aligned BVD structure 322(1) is coupled to a voltage V_MD_304(3) on row-W_205F(3)-aligned VD structure 320.

In FIG. 3C, a zoomed-in view R_T1' shows resistor R_T1 in more detail. In zoomed-in view R_T1', silicide-sandwiched S/D regions 304(1), 304(2) and 304(3) are correspondingly represented by resistors R_304(1), R_304(2) and R_304(3). In more detail, through resistor R_304(1), a voltage V_BVD_304(1) on row-W_205F(1)-aligned BVD structure 322(1) is coupled to a voltage V_MD_304(1) on a portion of MD contact structure 318' which is aligned with row W_205F(1). The voltage V_MD_304(1) on the portion of MD contact structure 318' aligned with row-W_205F(1) is the same as a voltage V_MD_304(2) on a portion of MD contact structure 318' which is aligned with row W_205F(2). Through resistor R_304(2), the voltage V_MD_304(2) on the portion of MD contact structure 318' aligned with row-W_205F(2) is coupled to a voltage V_BM0_304(2) on a portion of row-W_205F(2)-aligned buried conductive (BM0) segment 336.

BM0 segment 336 is in a first buried layer of metallization (BM_1st). In FIG. 3A, the BM_1st layer is BM0. FIG. 3A assumes a numbering convention in which the BM_1st layer and a corresponding first buried layer of interconnection (BVIA_1st layer) (not shown) are referred to correspondingly as BM0 and BVIA0. In some embodiments, the numbering convention assumes that the BM_1st layer is BM1 and the BVIA_1st layer is BVIA1.

Returning to FIG. 3C, the voltage V_BM0_304(2) on the portion of BM0 segment 336 aligned with row W_205F(2) is the same as a voltage V_BM0_304(3) on a portion of BM0 segment 336 which is aligned with row W_205F(3). Through resistor R_304(3), the voltage V_BM0_304(3) on the portion of BM0 segment 336 aligned with row W_205F (3) is coupled to a voltage V_MD_304(3) on row-W_205F (3)-aligned VD structure 320.

Figure 4B:
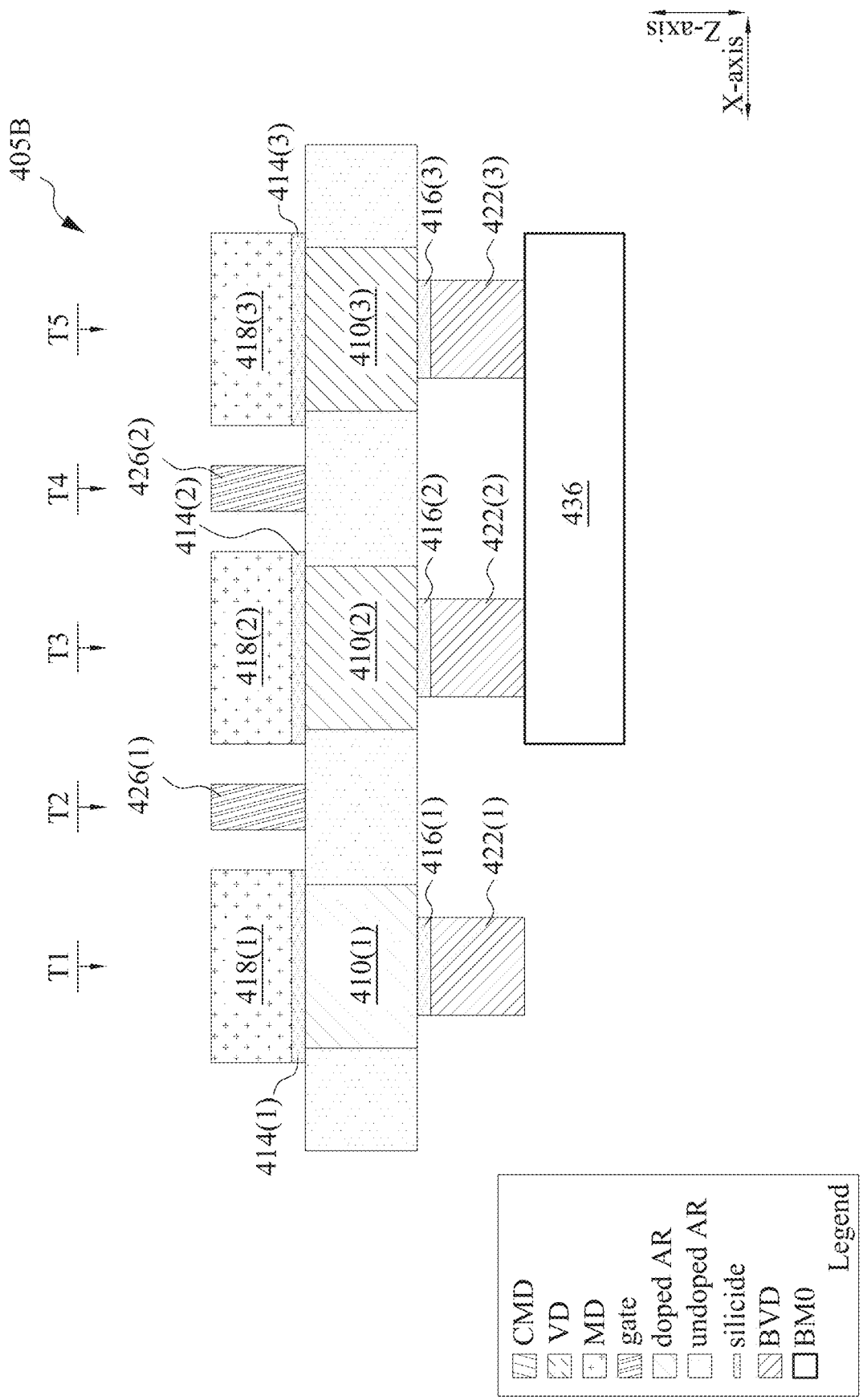
FIGS. 4B-4C are corresponding cross-sections, in accordance with some embodiments.
Figure 4C:
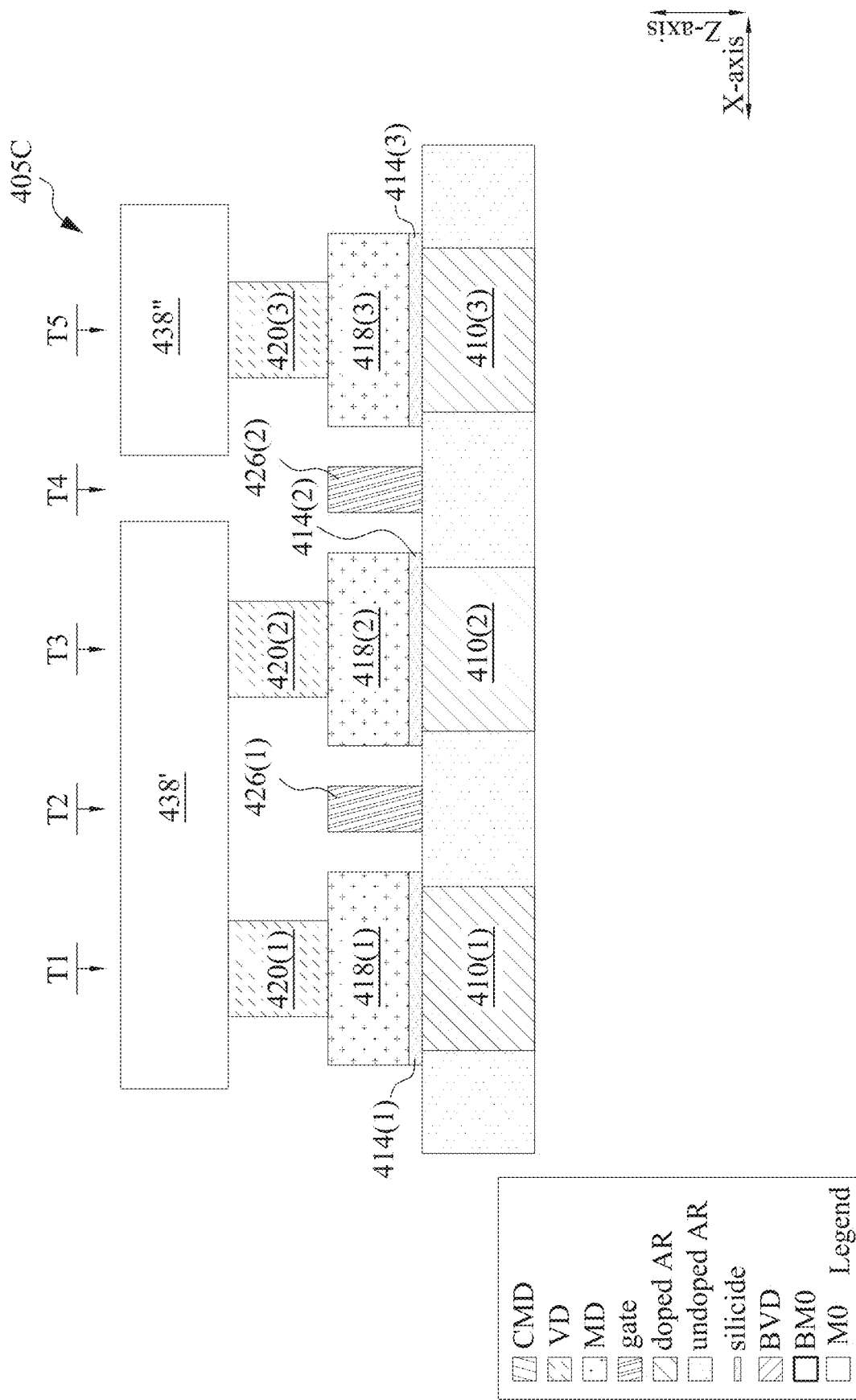
Figure 4D:
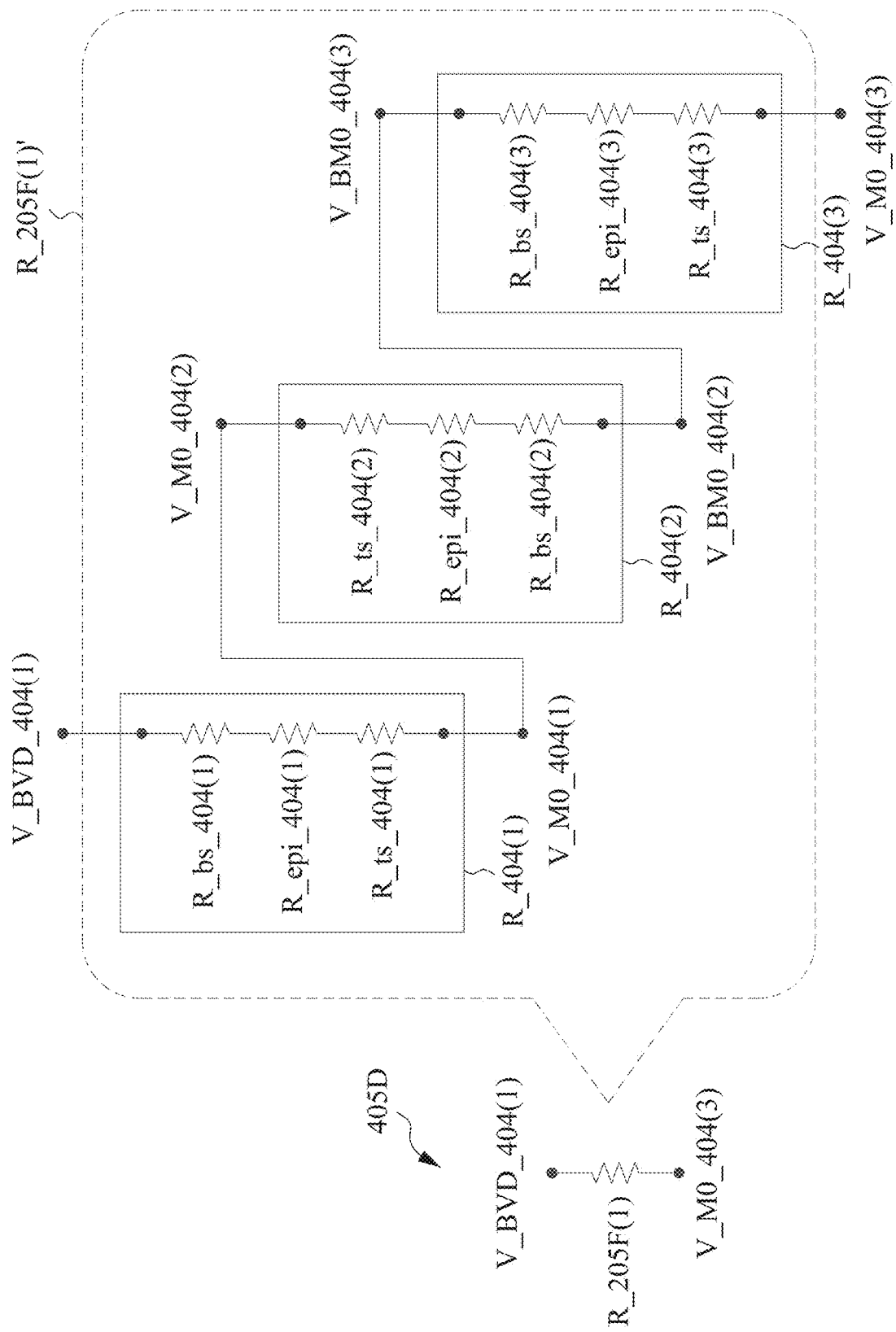
FIGS. 4D-4E are corresponding circuit diagrams, in accordance with some embodiments.
Figure 4E:
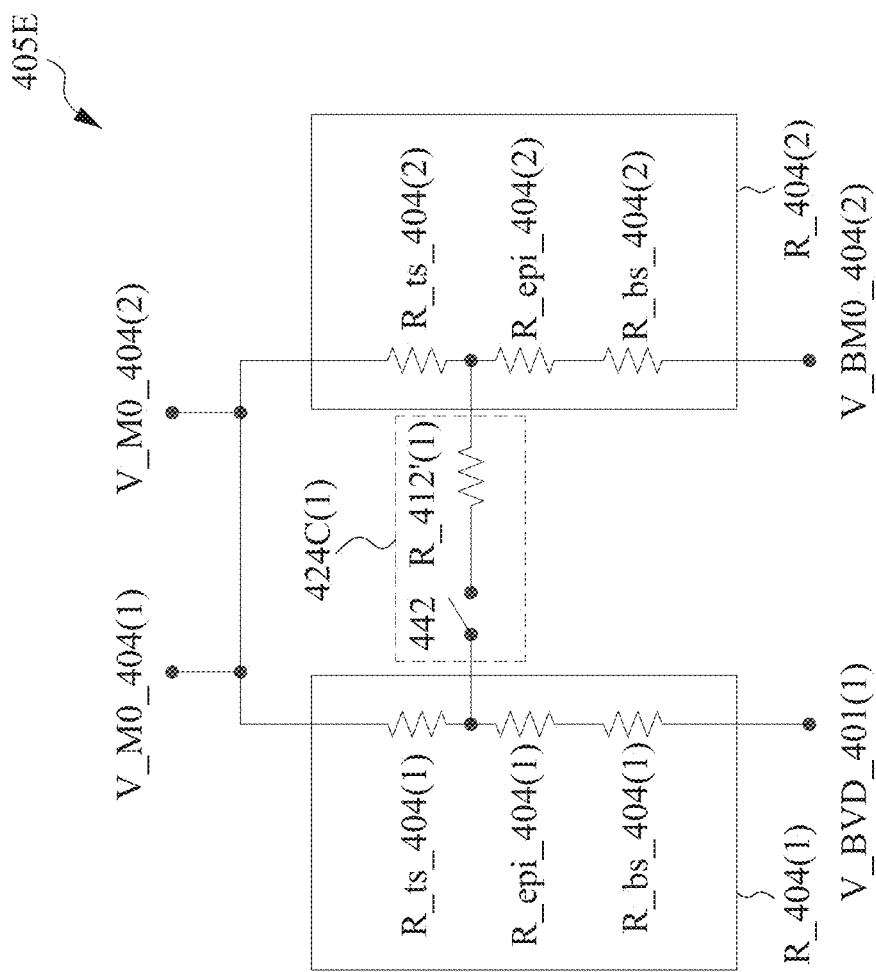

FIG. 4A is a layout diagram 405A, in accordance with some embodiments. FIGS. 4B-4C are corresponding cross-sections 405B and 405C of a semiconductor device 405B, in accordance with some embodiments. FIGS. 4D and 4E are corresponding circuit diagrams 405D and 405E representing corresponding first and second aspects of FIGS. 4B-4C, in accordance with some embodiments.

FIGS. 4A-4E follow a similar numbering scheme to that of FIGS. 3A-3E. Though corresponding, some components also differ. To help identify components which correspond but nevertheless have differences, the numbering convention uses 4-series numbers for FIGS. 4A-3C while the numbering convention for FIGS. 3A-3E uses 3-series numbers. For example, item 404(1) in row W_205F(1) of FIG. 4A is a silicide-sandwiched region and corresponding item 304(1) in FIG. 3A is a silicide-sandwiched region, and wherein: similarities are reflected in the common root_04(1); and differences are reflected in the corresponding leading digit 4 in FIG. 4A and 3 in FIG. 3A. Also, for example: 404(1) is silicide-sandwiched S/D region; R_ts_404(1), R_ts_404(2)

and R_ts_404(3) are corresponding resistances; 410(1), 410(2) and 410(3) are corresponding doped portions; 414(1), 414(2) and 414(3) are corresponding top silicide layers; 418(3) is an MD contact structure; 422(3) is a BVD structure; 426(1) and 426(2) are corresponding gate structures; and 420 is a VD structure. For brevity, the discussion will focus more on differences between FIGS. 4A-4E and FIGS. 3A-3E than on similarities.

The semiconductor device represented by cross-sections 405B and 405C is an example of a semiconductor device based on layout diagram 405A. Conversely, layout diagram 405A is representative of cross-section 405B. Cross-section line IIIB-IIIB' in FIG. 4A shows how FIG. 4B relates to FIG. 4A. As such, individual shapes (also known as patterns) in layout diagram 405A are representative of individual structures in cross-section 405B. For simplicity of discussion, elements in layout diagram 405A (and, again, in other layout diagrams included herein) will be referred to as if they are structures rather than shapes per se. For simplicity of illustration, not all of elements in layout diagram 405A are labeled with item numbers.

Layout diagram 405A is arranged into three rows W_205F(1), W_205F(2) and W_205F(3) which extend in the direction of the X-axis. Each of rows W_205F(1), W_205F(2) and W_205F(3) is a version of layout diagram 205F of FIG. 2F. Each of rows W_205F(1), W_205F(2) and W_205F(3) additionally includes: a BM0 segment, of which only BM0 segment 436 in row W_205F(1) is called out with a reference number; a non-buried conductive (M0) segment 438, of which only M0 segment 438 in row W_205F(1) is called out with a reference number; and a cut-M0 (CM0) shape, of which only CM0 shape 440 is called out with a reference number. M0 segment 438 is in a first non-buried layer of metallization BM_1st).

In FIG. 4A, the M_1st layer is M0. FIG. 4A assumes a numbering convention in which the M_1st layer and a corresponding first non-buried layer of interconnection (VIA_1st layer) (not shown) are referred to correspondingly as M0 and VIA0. In some embodiments, the numbering convention assumes that the M_1st layer is M1 and the VI_1st layer is BVIA1.

In layout diagram 405A, CM0 shape 440 indicates that M0 segment 438 is to be cut into two parts, with the two parts being corresponding M0 segment 438' and M0 segment 438" in FIG. 4C.

Again, FIG. 4D is a circuit diagram 405D representing a first aspect of FIGS. 4B and 4C. FIG. 4D also is a circuit diagram representing some of the row-W_205F(1)-aligned components of FIG. 4A.

In circuit diagram 405D, silicide-sandwiched S/D regions 404(1), 404(2) and 404(3) of row W_205F(1) together represent a resistor R_205F(1). The silicide-sandwiched S/D regions of row W_205F(2) together represent a resistor R_205F(2). The silicide-sandwiched S/D regions of row W_205F(3) together represent a resistor R_205F(3). In some embodiments, R_205F(1) is configured as a heater, R_205F(2) is configured as a thermal sensor, e.g., a thermistor, and R_205F(3) is configured as a heater.

Through resistor R_404(1), a voltage V_BVD_404(1) on row-W_205F(1)-aligned BVD structure 422(1) is coupled to a voltage V_M0_404(3) on row-W_205F(1)-aligned VD structure 420(3).

In FIG. 4D, a zoomed-in view R_205F(1)' shows resistor R_205F(1) in more detail. In zoomed-in view R_205F(1)', silicide-sandwiched S/D regions 404(1), 404(2) and 404(3) are correspondingly represented by resistors R_404(1), R_404(2) and R_404(3).

In more detail, through resistor R_404(1), a voltage V_BVD_404(1) on BVD structure 422(1) is coupled to a voltage V_M0_404(1) on a portion of an M0 segment 438' which is aligned with track T1.

In FIG. 4A, the first non-buried layer of metallization (M_1st layer) is M0. FIG. 4A assumes a numbering convention in which the M_1st layer and a corresponding first non-buried layer of interconnection (VIA_1st layer) (not shown) are referred to correspondingly as M0 and VIA0. In some embodiments, the numbering convention assumes that the M_1st layer is M1 and the VI_1st layer is VIA1.

Returning to FIG. 4D, the voltage V_M0_404(1) on the portion of M0 segment 438 aligned with track T1 is the same as a voltage V_M0_404(2) on a portion of M0 segment 438' which is aligned with track T3. Through resistor R_404(2), the voltage V_M0_404(2) on the portion of M0 segment 438' aligned with track T3 is coupled to a voltage V_BM0_404(2) on a portion of a BM0 segment 436 which is aligned with track T3. BM0 segment 436 is in buried metallization layer BM0. The voltage V_BM0_404(2) on the portion of BM0 segment 436 aligned with track T3 is the same as a voltage V_BM0_404(3) on a portion of BM0 segment 436 which is aligned with track T5. Through resistor R_404(3), the voltage V_BM0_404(3) on the portion of BM0 segment 436 aligned with track T5 is coupled to a voltage V_M0_404(3) on a portion of M0 segment 438" which is aligned with track T5.

Again, FIG. 4E is a circuit diagram 405E representing a second aspect of FIGS. 4B and 4C. FIG. 4E also is a circuit diagram representing some of the row-W_205F(1)-aligned components of FIG. 4A.

Circuit diagram 405E represents a temperature calibration circuit that includes active transistor 424C(1). In FIG. 4E, the effect on circuit diagram 405E of active transistor 424C(1) is modeled as a series coupling of a switch 442 and a resistor R_412'(1), the latter corresponding to the resistance of channel portion 412'(1). Silicide-sandwiched S/D regions 404(1) and 404(2) are correspondingly represented by resistors R_404(1) and R_404(2). Circuit diagram 405E assumes that at least one of the doped portion of silicide-sandwiched S/D region 404(1) and the doped portion of silicide-sandwiched S/D region 404(2) is configured as a thermistor.

In FIG. 4E, when active transistor 424C(1) is turned OFF, i.e., when switch 442 is open, voltage V_BVD_404(1) on row-W_205F(1)-aligned BVD structure 422(1) is coupled to voltage V_BM0_404(2) on row-W_205F(1)-aligned BVD structure 422(2) through a first signal path which includes a series coupling of resistors R_404(1) and 404(2).

More particularly, the first signal path includes the following. BVD structure 422(1) is coupled to a first terminal of resistor R_404(1). Through MD contact structure 418(1) and VD structure 420(1), a second terminal of resistor R_404(1) is coupled to a portion of M0 segment 438' which is aligned with track T1. A voltage V_M0_404(1) is shown on the portion of M0 segment 438' which is aligned with track T1. The voltage V_M0_404(1) on the portion of M0 segment 438' aligned with track T1 is the same as a voltage V_M0_404(2) on a portion of M0 segment 438' which is aligned with track T3. Through VD structure 420(2) and MD contact structure 418(2), the portion of M0 segment 438' aligned with track T3 is coupled to a first terminal of resistor R_404(2). Through BVD structure 422(2), a second terminal of resistor R_404(2) is coupled to a portion of a BM0 segment 436 which is aligned with track T3. The voltage V_BM0_404(2) is shown on the portion of a BM0 segment 436 which is aligned with track T3.

In FIG. 4E, when active transistor 424C(1) is turned ON, i.e., when switch 442 is closed, current flows through the first signal path (discussed above) and a second signal path.

More particularly, the second signal path includes the following. BVD structure 422(1) is coupled to a first terminal of resistor R_Bs_404(1), the latter representing the resistance of the bottom silicide layer of silicide-sandwiched region 404(1).

A second terminal of R_Bs_404(1) is coupled to a first terminal of resistor R_epi_404(1), the latter representing the resistance of the doped portion of silicide-sandwiched region 404(1). A third terminal of resistor R_epi_404(1) is coupled to a first terminal of switch 442. A second terminal of switch 442 is coupled to a first terminal of R_412'(1), the latter (again) corresponding to the resistance of channel portion 412'(1). A second terminal of resistor R_412'(1) is coupled to a first terminal of resistor R_epi_404(2), the latter representing the resistance of the doped portion of silicide-sandwiched region 404(2).

A second terminal of resistor R_epi_404(2) is coupled to a first terminal of resistor R_Bs_404(2), the latter representing the resistance of the bottom silicide layer of silicide-sandwiched region 404(2). Through BVD structure 422(2), the second terminal of resistor R_Bs_404(2) is coupled to the portion of a BM0 segment 436 which is aligned with track T3.

Using circuit 405E, temperature calibration is achieved by comparing a first voltage difference between V_BVD_401(1) and V_BM0_404(2) when switch 442 is open, i.e., when active transistor 424C(1) is OFF, and a second voltage difference between V_BVD_401(1) and V_BM0_404(2) when switch 442 is closed, i.e., when active transistor 424C(1) is ON.

Figure 5C:
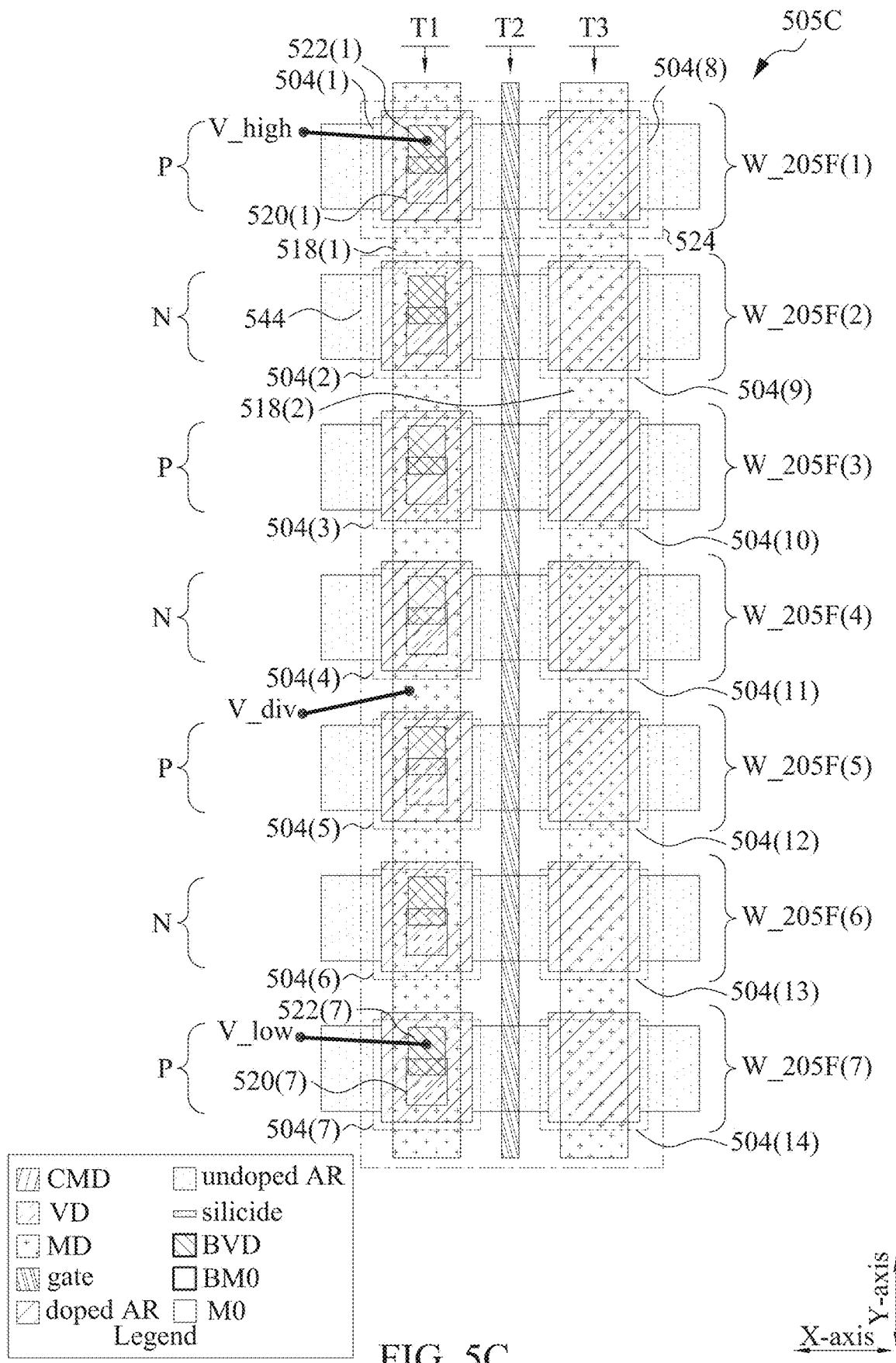
FIG. 5C is a circuit diagram, in accordance with some embodiments.

FIGS. 5A and 5C are corresponding layout diagrams 505A and 505C, in accordance with some embodiments. FIG. 5B is a circuit diagram 505B representing FIGS. 5A and 5C, in accordance with some embodiments.

FIGS. 5A-5C follow a similar numbering scheme to that of FIGS. 3A-3C. Though corresponding, some components also differ. To help identify components which correspond but nevertheless have differences, the numbering convention uses 5-series numbers for FIGS. 5A-5C while the numbering convention for FIGS. 3A-3C uses 3-series numbers. For example, item 504(1) in row W_205F(1) of FIG. 5A is a silicide-sandwiched region and corresponding T1-aligned item 304(1) in FIG. 3A is a silicide-sandwiched region, and wherein: similarities are reflected in the common root_04(1); and differences are reflected in the corresponding leading digit 5 in FIG. 5A and 3 in FIG. 3A. For brevity, the discussion will focus more on differences between FIGS. 5A-5C and FIGS. 3A-3C than on similarities.

Layout diagram 505A is representative of a semiconductor device based on layout diagram 505A. As such, individual shapes (also known as patterns) in layout diagram 505A are representative of individual structures in the semiconductor device represented by layout diagram 505A. For simplicity of discussion, elements in layout diagram 505A (and, again, in other layout diagrams included herein) will be referred to as if they are structures rather than shapes per se. Also, for example: 504(3), 504(4), 504(5), 504(6), 504(9), 504(10), 504(11), 504(12), 504(13) and 504(14) are corresponding silicide-sandwiched S/D regions. For simplicity of illustration, not all of elements in layout diagram 505A are labeled with item numbers.

Layout diagram 505A is organized according to track lines T1, T2, T3, T4, T5, T6, T7, T8, T9, T10, T11, T12 and T13. Layout diagram 505A is arranged as a row W_505, which is a version of layout diagram 205F of FIG. 2F. Row W_505 includes an active transistor 524, and a set 544 of dummy (inactive) transistors.

In FIG. 5A, T1-aligned BVD structure 522(1) is coupled to T13-aligned BVD structure 522(7) through BM0 segment 536. BM0 segment 536 corresponds to a node 546 in FIG. 3B. T2-aligned silicide-sandwiched portion 504(2) is thermally proximal relative to T1-aligned silicide-sandwiched portion 504(1). In some embodiments, a first structure and a second structure are thermally proximal to each other if the second structure is less than or equal to about 100 nm from the first structure. In some embodiments in which a left edge of T2-aligned silicide-sandwiched portion 504(2) is separated from a right edge of T1-aligned silicide-sandwiched portion 504(1) by distance less than or equal to about 100 nm, T2-aligned silicide-sandwiched portion 504(2) is thermally proximal relative to T1-aligned silicide-sandwiched portion 504(1).

T13-aligned silicide-sandwiched portion 504(7) is thermally distal relative to T1-aligned silicide-sandwiched portion 504(1). In some embodiments, a first structure and a second structure are thermally distal to each other if the second structure is about 1 μm or farther from the first structure. In some embodiments in which a left edge of T13-aligned silicide-sandwiched portion 504(7) is separated from a right edge of T1-aligned silicide-sandwiched portion 504(1) by distance equal to or greater than about 1 μm, T13-aligned silicide-sandwiched portion 504(7) is thermally distal relative to T1-aligned silicide-sandwiched portion 504(1).

In some embodiments, a first structure and a second structure are thermally distal to each other if a distance, G, from the first structure to the second structure is in a range ($\approx$1 μm)$\leq$G$\leq$($\approx$1 mm). In some embodiments in which a left edge of T13-aligned silicide-sandwiched portion 504(7) is separated from a right edge of T1-aligned silicide-sandwiched portion 504(1) by distance G having the range ($\approx$1 μm)$\leq$G$\leq$($\approx$1 mm), T13-aligned silicide-sandwiched portion 504(7) is thermally distal relative to T1-aligned silicide-sandwiched portion 504(1).

Through resistor R_504(1) (FIG. 5B) corresponding to silicide-sandwiched portion 504(1), a voltage V_high on T1-aligned VD structure 520(1) is coupled to a voltage V_div on BM0 segment 536. Through T13-aligned BVD structure 522(7) and through resistor R_504(7) corresponding to T13-aligned BVD structure 522(7), voltage V_div on BM0 segment 536 is coupled to a voltage V_low on T13-aligned VD structure 520(7).

Circuit diagram 505B represents a temperature sensing circuit as a voltage divider. A signal path through voltage divider 505B is as follows. The voltage V_high is coupled to node 546 through resistor R_504(1) corresponding to T1-aligned BVD structure 522(1). Node 546 is coupled to the voltage V_low through resistor R_504(7) corresponding to T13-aligned BVD structure 522(7). Voltage divider 505B produces divided voltage V_div on node 546.

In FIG. 5B, voltage divider 505B assumes that resistor R_504(1), i.e., the doped portion of silicide-sandwiched S/D region 504(1), is configured as a thermistor. As such, divided voltage V_div is indicating of a temperature difference between resistor R_504(1), i.e., the doped portion of silicide-sandwiched S/D region 504(1), and resistor R_504(7), i.e., the doped portion of silicide-sandwiched S/D region 504(7). In some embodiments, resistor R_504(7), i.e., the doped portion of silicide-sandwiched S/D region 504(7), is configured as a thermistor rather than resistor R_504(1). In some embodiments, voltage V_high is VDD. In some embodiments, voltage V_low VSS. In some embodiments, voltages V_high and V_low are voltages other than correspondingly VDD and VSS.

Layout diagram 505A is organized according to track lines T1, T2 and T3. Layout diagram 305A is arranged as a row W_505, which is a version of the row of layout diagram 205F of FIG. 2F.

In FIG. 5A, the active region is configured for P-type conductivity, e.g., PMOS transistors, or for N-type conductivity, e.g., NMOS transistors.

In FIG. 5C, layout diagram 505C is organized according to track lines T1, T2 and T3. Layout diagram 505C is arranged as rows W_205F(1), W_205F(2), W_205F(3), W_205F(4), W_205F(5), W_205F(6) and W_205F(7). Each of rows W_205F(1)-W_205F(7) is a version of row W_205F (3) of layout diagram 305A of FIG. 3A. Row W_205F(1) includes an active transistor 524. Rows W_205F(2)-W_205F(6) include a set 544 of dummy (inactive) transistors.

In FIG. 5C, the active regions corresponding to the odd rows W_205F(1), W_205F(3), W_205F(5) and W_205F(7) are configured for P-type conductivity, e.g., PMOS transistors, and the active regions corresponding to the even rows W_205F(2), W_205F(4) and W_205F(6) are configured for N-type conductivity, e.g., NMOS transistors. In some embodiments, the active regions corresponding to the odd rows are configured for N-type conductivity, and the active region corresponding to the even rows are configured for P-type conductivity.

In FIG. 5C, row-W_205(1)-aligned BVD structure 522(1) is coupled to row-W_205F(7)-aligned BVD structure 522(7) through MD contact structure 518(1). MD contact structure 518(1) corresponds to a node 546 in FIG. 3B. Row-W_205F (2)-aligned silicide-sandwiched portion 504(2) is thermally proximal relative to row-W_205F(1)-aligned silicide-sandwiched portion 504(1). In some embodiments, a first structure and a second structure are thermally proximal to each other if the second structure is less than or equal to about 100 nm from the first structure.

In some embodiments in which a top edge of row-W_205F(2)-aligned silicide-sandwiched portion 504(2) is separated from a bottom edge of row-W_205F(1)-aligned silicide-sandwiched portion 504(1) by distance less than or equal to about 100 nm, row-W_205F(2)-aligned silicide-sandwiched portion 504(2) is thermally proximal relative to row-W_205F(1)-aligned silicide-sandwiched portion 504 (1).

In some embodiments, for a first structure and a second structure aligned to the same track, wherein the first structure is also aligned with a first row, the second structure is thermally proximal to the first structure if the second structure is aligned with a second row that has zero or one intervening row between the second row and the first row.

Row-W_205F(7)-aligned silicide-sandwiched portion 504(7) is thermally distal relative to row-W_205F(1)-aligned silicide-sandwiched portion 504(1). a first structure and a second structure are thermally distal to each other if a distance, G, from the first structure to the second structure is in a range (≈1 µm)≤G≤(≈1 mm). In some embodiments in which a top edge of row-W_205F(7)-aligned silicide-sandwiched portion 504(7) is separated from a bottom edge of row-W_205F(1)-aligned silicide-sandwiched portion 504(1) by distance G having the range (≈1 µm)≤G≤(≈1 mm), row-W_205F(7)-aligned silicide-sandwiched portion 504(7) is thermally distal relative to row-W_205F(1)-aligned silicide-sandwiched portion 504(1). In some embodiments, for a first structure and a second structure aligned to the same track, wherein the first structure is also aligned with a first row, the second structure is thermally distal to the first structure if the second structure is aligned with a second row that has M rows between the second row and the first row, where M is a positive integer and 2≤M≤(≈1000).

Through resistor R_504(1) (FIG. 5B) corresponding to silicide-sandwiched portion 504(1), a voltage V_high on row-W_205F(1)-aligned VD structure 520(1) is coupled to a voltage V_div on MD contact structure 518(1). Through resistor R_504(7) corresponding to row-W_205F(7)-aligned silicide-sandwiched portion 504(7), voltage V_div on MD contact structure 518(1) is coupled to a voltage V_low on row-W_205F(7)-aligned BVD structure 522(7).

Figure 6A:
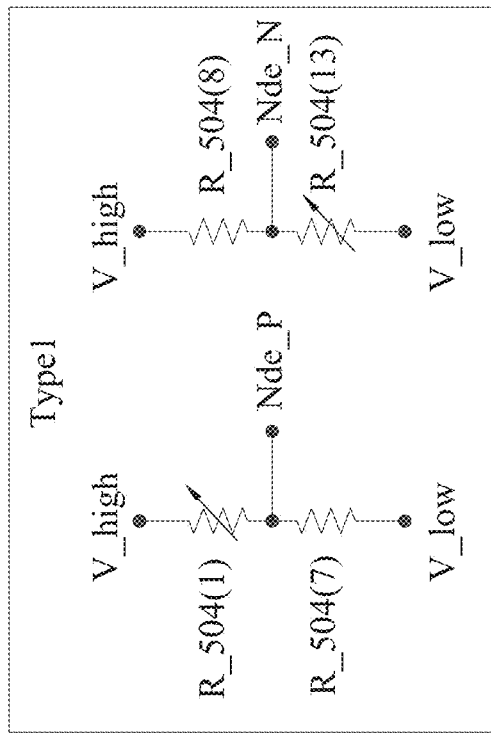
FIGS. 6A-6E are corresponding circuit diagrams, in accordance with some embodiments.
Figure 6C:
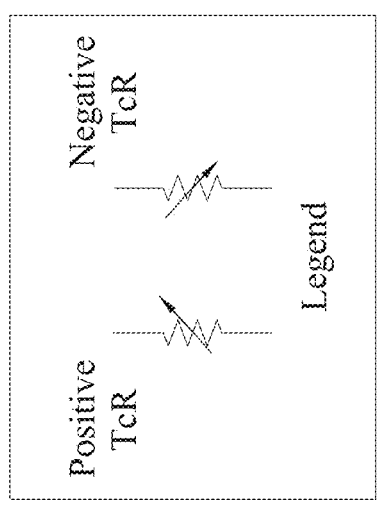
Figure 6C:
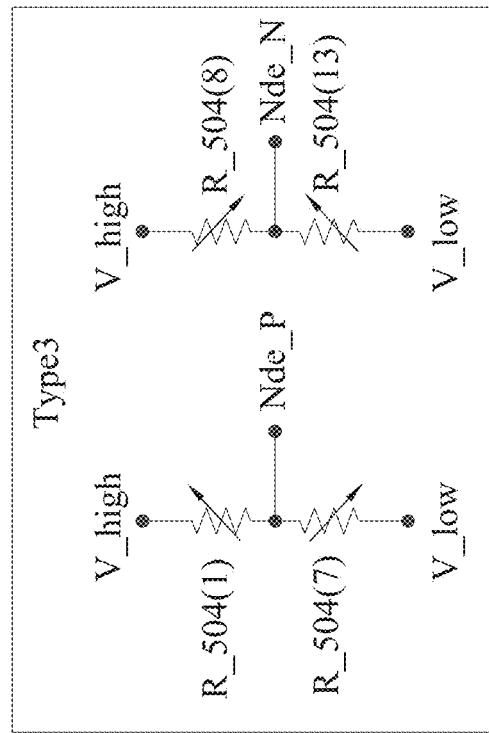
Figure 6B:
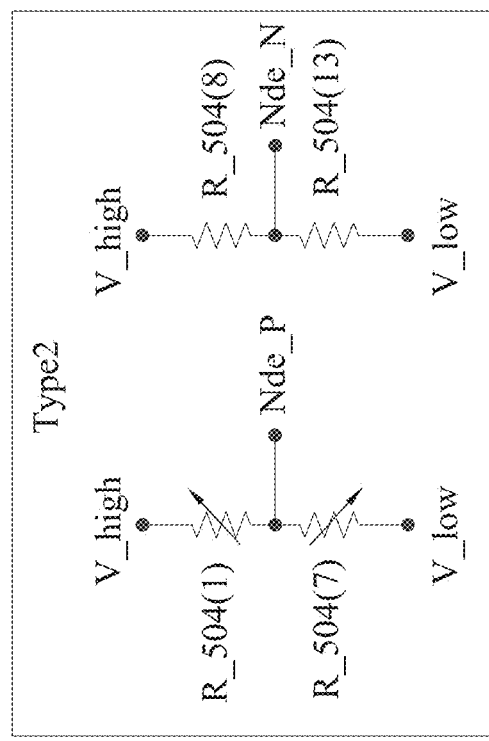

FIGS. 6A, 6B and 6C are corresponding Type 1, Type 2 and Type 3 Wheatstone Bridge configurations, in accordance with some embodiments.

Each of FIGS. 6A-6C is a variation of voltage divider 505B of FIG. 5B. More particularly, each of FIGS. 6A-6C includes voltage divider 505B and a second voltage divider. A node Nde_P in FIG. 6A corresponds to MD contact structure 518(1) in FIG. 5C. The second voltage divider has a T3-aligned signal path.

According to the T3-aligned signal path of the second voltage divider in FIG. 5B, through a resistor R_504(8) corresponding to silicide-sandwiched portion 504(8), a voltage V_high on a T3-aligned and a row W_205F(1)-aligned BVD structure (not shown) is coupled to a T3-aligned and row-W_205F(7)-aligned BVD structure (not shown) 522(7) through MD contact structure 518(2). MD contact structure 518(2) corresponds to a node Nde_N in FIG. 6A.

In FIG. 6A, node Nde_P represents the P-type side of Wheatstone Bridge Type 1. Node Nde_N represents the N-type side of Wheatstone Bridge Type 1. FIG. 6A assumes that each of resistors R_504(1) and R_504(13) is a thermistor with a positive TcR.

FIG. 6B assumes: resistor R_504(1) is a thermistor with a positive TcR; and resistor R_504(7) is a thermistor with a negative TcR. FIG. 6C assumes: each of resistors R_504(1) and R_504(13) is a thermistor with a positive TcR; and each of resistors R_504(7) and R_504(8) is a thermistor with a negative TcR. In some embodiments, combinations of thermistors and resistors are different than the combinations shown in corresponding FIGS. 6A-6C.

In FIG. 6A, a voltage V_Nde_P on node Nde_P is $$V\_Nde\_P = \frac{(1 + TcR\_doped)R\_504(7)}{(1 + TcR\_doped)R\_505(1) + (1 + TcR\_doped)R\_504(7)}$$

where TcR_doped is the temperature coefficient of the doped portion of the doped portion of the corresponding resistor.

Figure 6D:
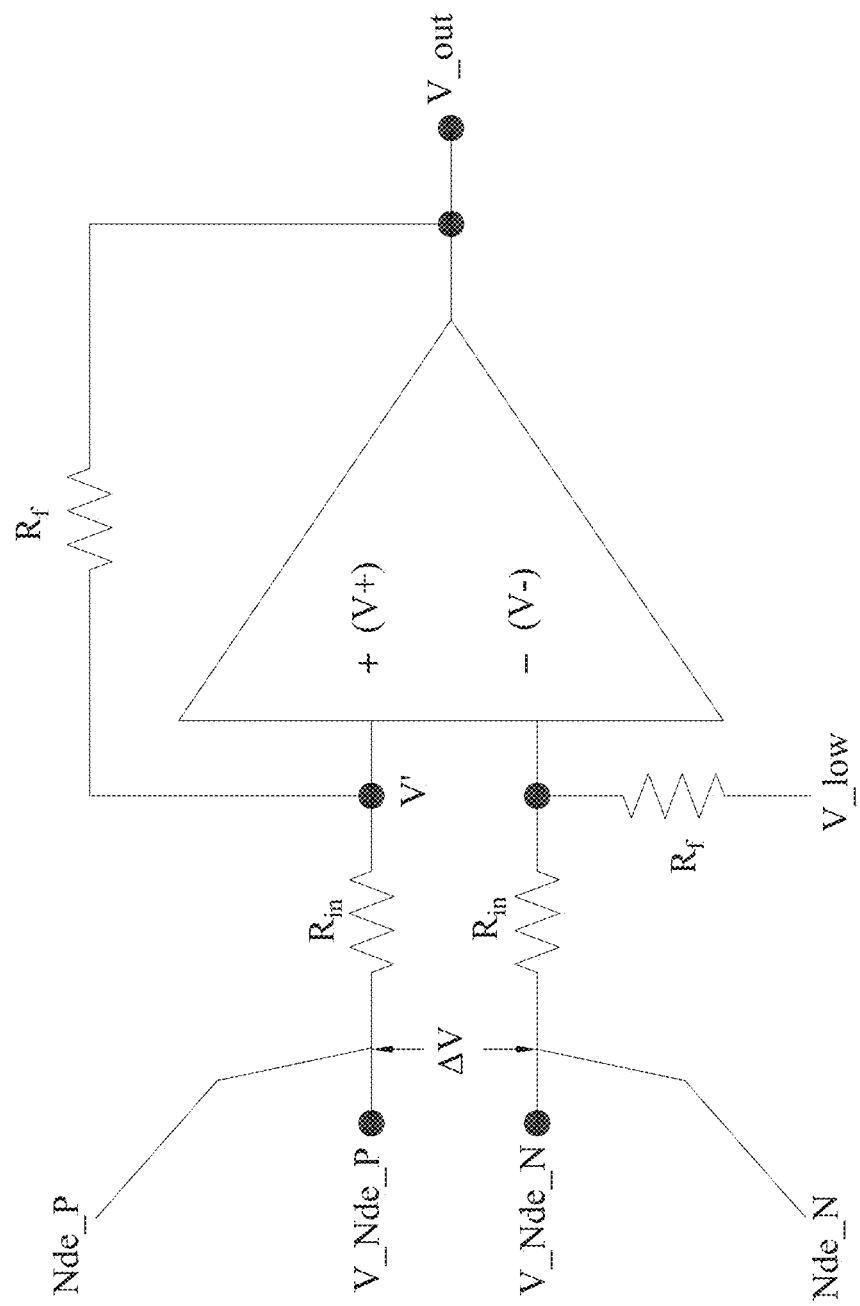

FIG. 6D is a circuit diagram, in accordance with some embodiments.

The circuit diagram of FIG. 6D is of a single-ended differential amplifier that is used with any of the Wheatstone Bridges of FIGS. 6A-6C. A non-inverting input of the single-ended differential amplifier receives a voltage V_Nde_P from node Nde_P, e.g., of FIG. 6A. An inverting input of the single-ended differential amplifier receives a voltage V_Nde_N from node Nde_N, e.g., of FIG. 6A. In some embodiments, the inverting input of the single-ended differential amplifier is configured to receive a reference voltage. The output of the single-ended differential amplifier is V_out. In some embodiments, V_out is as follows:

$$V\_out = \left(\frac{R_f}{R_{in}}\right)\frac{\left(V\_low - V\_Nde\_P + \left(\frac{R_f}{R_{in}}\right)(V\_Nde\_N - V\_Nde\_P)\right)}{1 + \left(\frac{R_f}{R_{in}}\right)}$$

To simplify V_out, let (V_Nde_P–V_Nde_N)=ΔV. Recalling V_high and V_low from FIGS. 6A-6C, ΔV can be represented as follows.

$$\Delta V = (V\_high - V\_low)\frac{\left(\frac{R\_504(7)}{R\_504(1)}\right) - \left(\frac{R\_504(13)}{R\_504(8)}\right)}{\left(1 + \frac{R\_504(7)}{R\_504(1)}\right)\left(1 + \frac{R\_504(13)}{R\_504(8)}\right)}$$

Substituting ΔV into the equation for V_out yields the following.

$$V\_out = \left(\frac{R_f}{R_{in}}\right)\frac{\left(V\_low - V\_Nde\_P + \left(\frac{R_f}{R_{in}}\right)(\Delta V)\right)}{1 + \left(\frac{R_f}{R_{in}}\right)}$$

Assume that V'≈(V+)≈(V−) due to a virtual short circuit during the operation of an operational amplifier (OPAMP). If V_Nde_P≈V_Nde_N, then ΔV=0, and so V_out can be represented as follows.

$$V\_out = \left(\frac{R_f}{R_{in}}\right)(V\_low - V\_Nde\_P)$$

Figure 6E:
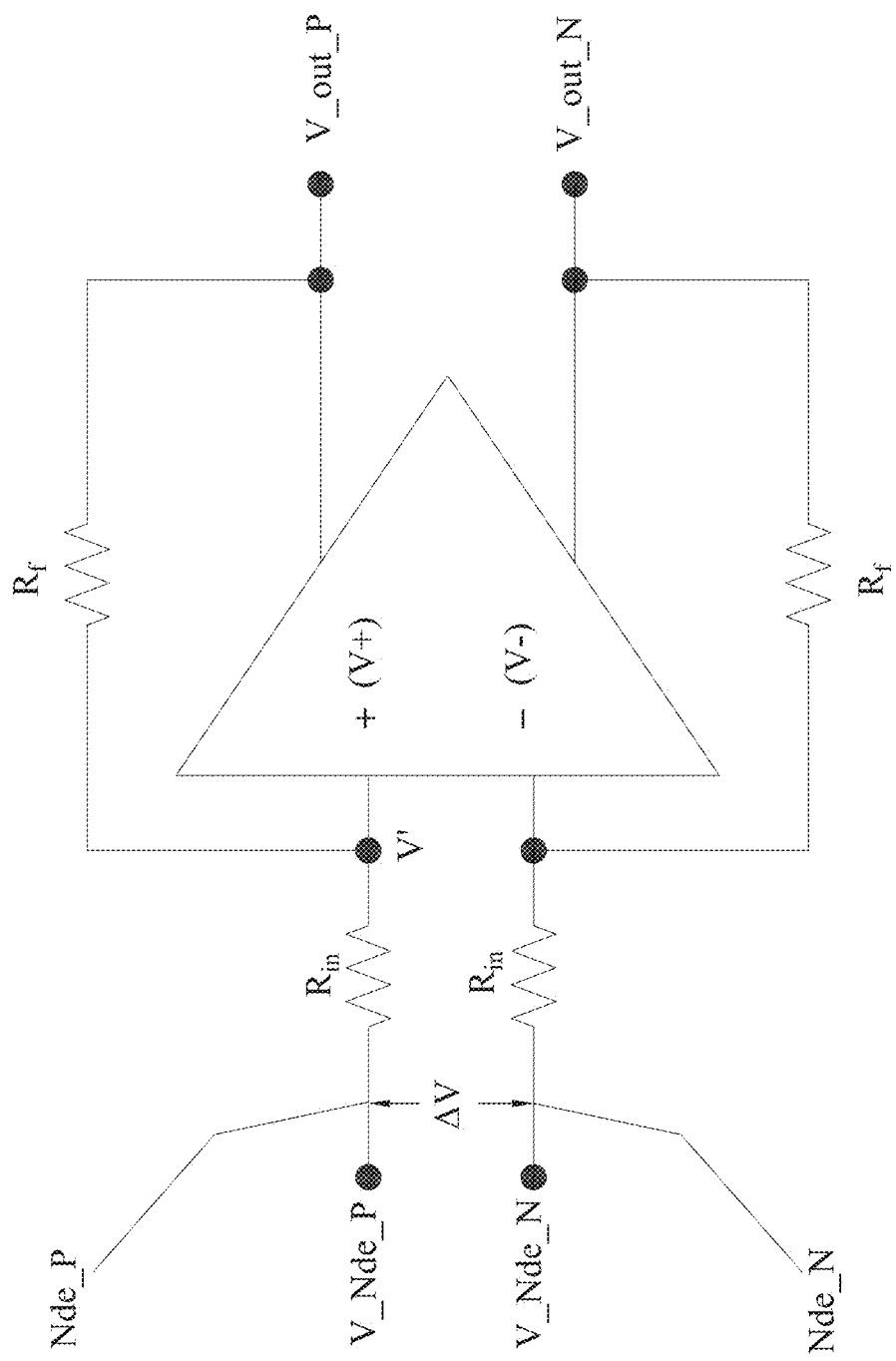

FIG. 6E is a circuit diagram, in accordance with some embodiments.

The circuit diagram of FIG. 6E is of a double-ended differential amplifier that is used with any of the Wheatstone Bridges of FIGS. 6A-6C. A non-inverting input of the double-ended differential amplifier receives a voltage V_Nde_P from node Nde_P, e.g., of FIG. 6A. An inverting input of the double-ended differential amplifier receives a voltage V_Nde_N from node Nde_N, e.g., of FIG. 6A. In some embodiments, the inverting input of the single-ended differential amplifier is configured to receive a reference voltage. First and second outputs of the double-ended differential amplifier correspondingly are V_out_P and V_out_N. In some embodiments, the difference between V_out_P and V_out_N is as follows.

$$V\_out\_p - V\_out\_n = -\left(\frac{R_f}{R_{in}}\right)(\Delta V)$$

It is noted that ΔV is as explained above regarding FIG. 6D.

Figure 7A:
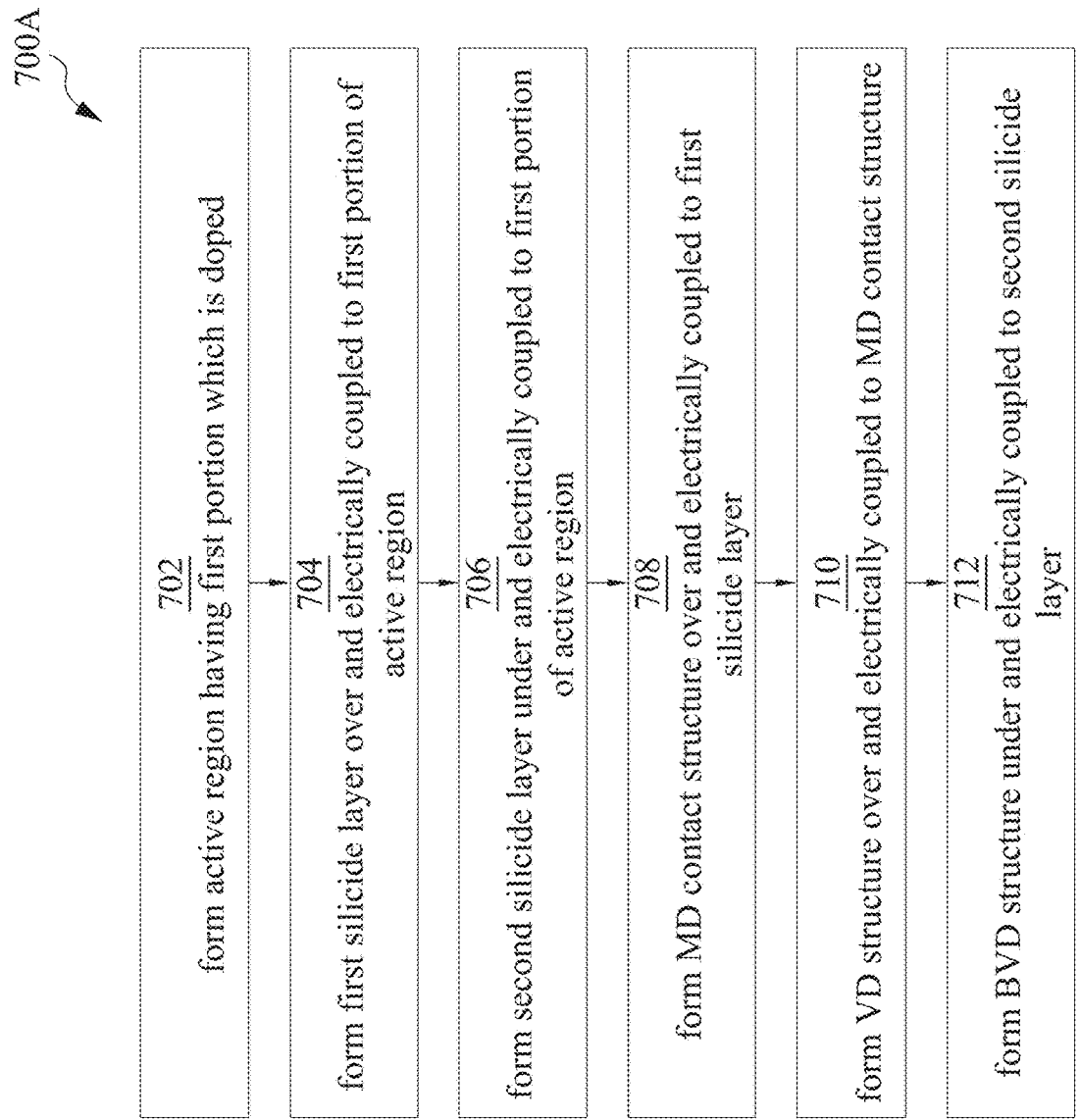
FIGS. 7A-7B and 8-9 are corresponding flowcharts, in accordance with some embodiments.

FIG. 7A is a flowchart of a 700A method of making manufacturing a semiconductor shape, in accordance with some embodiments.

Flowchart 700A includes blocks 702-712. At block 702, an active region is formed having a first portion which is doped. An example of the active region is active region 203 of FIG. 2B. An example of the doped first portion is doped portion 210 of FIG. 2B. In some embodiments, block 702 includes: forming (no corresponding flowchart-block shown) the active region from a first semiconductor material; and doping (no corresponding flowchart-block shown) the first semiconductor material in the first portion so as to become a second semiconductor material which is different than the first semiconductor material. From block 702, flow proceeds to block 704.

At block 704, a first silicide layer is formed over the first doped portion of the active region. An example of the first silicide layer is top silicide layer 214 of FIG. 2B. From block 704, flow proceeds to block 706.

At block 706, a second silicide layer is formed under the first doped portion of the active region. An example of the second silicide layer is bottom silicide layer 216 of FIG. 2B. From block 706, flow proceeds to block 708.

At block 708, an MD contact shape is formed over the first silicide layer. An example of the MD contact shape is MD contact shape 218 of FIG. 2B. From block 708, flow proceeds to block 710.

At block 710, a VD shape is formed over the MD contact shape. An example of the VD shape is VD shape 220 of FIG. 2B. From block 710, flow proceeds to block 712.

At block 712, a first BVD structure is formed under and electrically coupled to the second silicide layer. An example of the BVD structure is BVD structure 222 of FIG. 2B. In some embodiments, flowchart 700A further includes: configuring (no corresponding flowchart-block shown) the semiconductor structure as a heater; or configuring (no corresponding flowchart-block shown) the semiconductor structure as a temperature sensor.

Figure 7B:
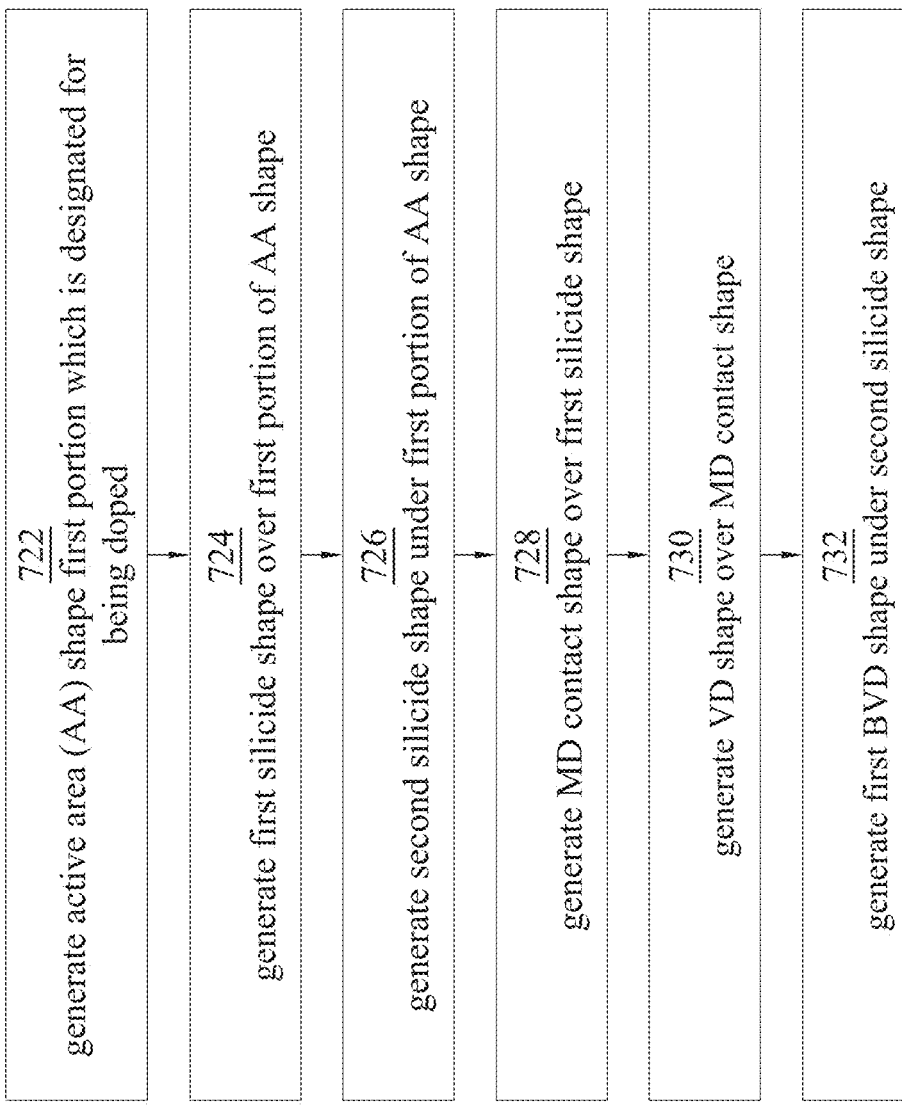

FIG. 7B is a flowchart 700B of a method of making manufacturing a semiconductor shape, in accordance with some embodiments.

Flowchart 720B includes blocks 722-732. At block 722, an active area (AA) shape is formed having a first portion which is designated for being doped. A layout diagram is representative of a semiconductor device. As such, individual shapes (also known as patterns) in a layout diagram are representative of individual structures in the semiconductor device represented by layout diagram. For simplicity of discussion, examples of elements in the layout diagram generated by flowchart 700B are structures corresponding to the shapes rather than shapes per se. An example of the AA shape is active region 203 of FIG. 2B. An example of the doped first portion is doped portion 210 of FIG. 2B. In some embodiments, block 722 includes: designating (no corresponding flowchart-block shown) the active region as being formed from a first semiconductor material; and (no corresponding flowchart-block shown) designating the first semiconductor material in the first portion as being formed from a second semiconductor material which is different than the first semiconductor material. From block 722, flow proceeds to block 724.

At block 724, a first silicide shape is formed over the first doped portion of the AA shape. An example of the first silicide shape is top silicide layer 214 of FIG. 2B. From block 724, flow proceeds to block 726.

At block 726, a second silicide shape is formed under the first doped portion of the AA shape. An example of the second silicide shape is bottom silicide layer 216 of FIG. 2B. From block 726, flow proceeds to block 728.

At block 728, an MD contact shape is formed over the first silicide shape. An example of the MD contact shape is MD contact shape 218 of FIG. 2B. From block 728, flow proceeds to block 730.

At block 730, a VD shape is formed over the MD contact shape. An example of the VD shape is VD shape 220 of FIG. 2B. From block 730, flow proceeds to block 732.

At block 732, a first BVD shape is formed under the second silicide shape. An example of the BVD shape is BVD shape 222 of FIG. 2B.

Figure 8:
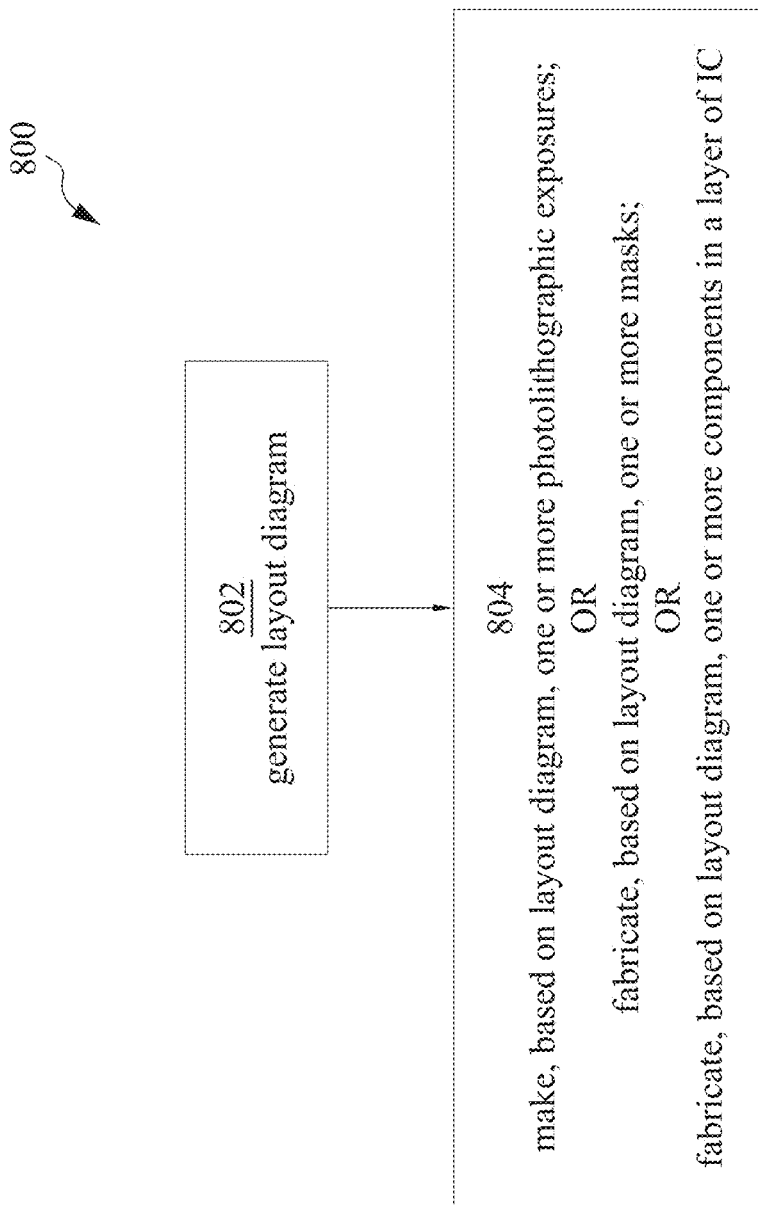

FIG. 8 is a flowchart of a method 800 of manufacturing a semiconductor device, in accordance with some embodiments.

Method 800 is implementable, for example, using EDA system 1000 (FIG. 10, discussed below) and an integrated circuit (IC), manufacturing system 1100 (FIG. 11, discussed below), in accordance with some embodiments. Examples of a semiconductor device which can be manufactured according to method 800 include semiconductor device 100 FIG. 1.

In FIG. 8, method 800 includes blocks 802-804. At block 802, a layout diagram is generated which, among other things, includes one or more of layout diagrams disclosed herein, or the like. Block 802 is implementable, for example, using EDA system 1000 (FIG. 10, discussed below), in accordance with some embodiments. From block 802, flow proceeds to block 804.

At block 804, based on the layout diagram, at least one of (A) one or more photolithographic exposures are made or (B) one or more semiconductor masks are fabricated or (C) one or more components in a layer of a semiconductor device are fabricated. See discussion below of FIG. 11.

Figure 9:
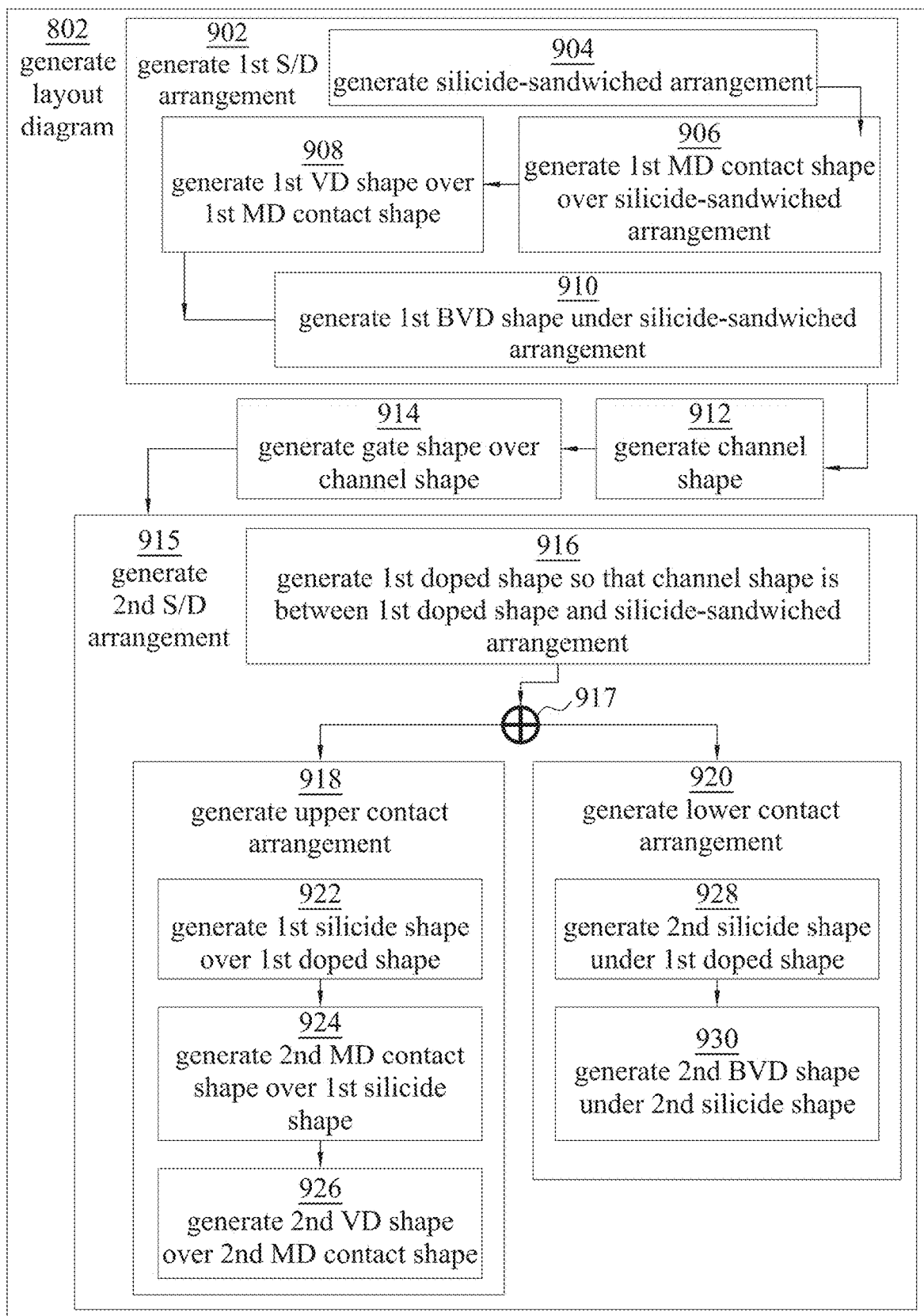

FIG. 9 is a flowchart of a method of generating a layout diagram, in accordance with some embodiments.

More particularly, the flowchart of FIG. 9 shows additional blocks included in block 802 of FIG. 8, in accordance with one or more embodiments.

In FIG. 9, the flowchart includes blocks 902-930. At block 902, a first source/drain (S/D) arrangement is formed. A layout diagram is representative of a semiconductor device. As such, individual shapes (also known as patterns) in a layout diagram are representative of individual structures in the semiconductor device represented by layout diagram. For simplicity of discussion, some examples of elements in the layout diagram generated by flowchart 700B are structures corresponding to the shapes rather than shapes per se. An example of the first S/D arrangement is S/D region 205B in FIG. 2B. Block 902 includes blocks 904-910.

At block 904, a silicide-sandwiched arrangement is generated. Examples of the silicide-sandwiched arrangement are silicide-sandwiched arrangement 204(1) of FIG. 2B, silicide-sandwiched arrangement 504(1) of FIG. 5A, silicide-sandwiched arrangements 504(1) of FIGS. 5A and 5C, or the like. From block 904, flow proceeds to block 906.

At block 906, a first MD contact shape is generated over the silicide-sandwiched arrangement. Examples of the first MD contact shape are MD contact structure 218 of FIG. 2B, MD contact shape 522(1) of FIGS. 5A and 5C, or the like. From block 906, flow proceeds to block 908.

At block 908, a first VD shape is generated over the first MD contact shape. Examples of the first VD shape are VD structure 220 of FIG. 2B, VD structure 520(1) of FIGS. 5A and 5C, or the like. From block 908, flow proceeds to block 910.

At block 910, a first BVD shape is generated under the first silicide-sandwiched arrangement. Examples of the first BVD shape are BVD structure 222 of FIG. 2B, BVD structure 522(1) of FIGS. 5A and 5C, or the like. From block 910, flow exits block 902 and proceeds to block 912.

At block 912, a channel shape is generated. Examples of the channel shape are channel portion 212' of FIG. 2B, the channel portion between silicide-sandwiched portions 504(1) and 504(2) of FIG. 5A, the channel portion between silicide-sandwiched portions 504(1) and 504(8) of FIG. 5C, or the like. From block 912, flow proceeds to block 914.

At block 914, a gate shape is generated over the channel shape. Examples of the gate shape are gate structure 226 of FIG. 2B, the gate structure aligned with track T2 in each of FIGS. 5A and 5C, or the like. From block 914, flow proceeds to block 915.

At block 915, a second S/D arrangement is generated. Block 916 includes blocks 916-920. At block 916, a first doped shape is generated so that the channel shape is between the first doped shape and the silicide-sandwiched arrangement. Examples of the first doped shape are doped portion 210 in silicide-sandwiched arrangement 204(2) of FIG. 2C, doped portion 210 in upper contact region 228 of FIG. 2D, doped portion 210 in lower contact region 230 of FIG. 2E, or the like. From block 916, flow proceeds to block 917.

At block 917, flow branches to either block 918 or block 920. In some embodiments, flow proceeds to each of blocks 918 and 920.

At block 918, an upper contact is generated. An example of the upper contact arrangement is upper contact region 228 of FIG. 2D, doped portion 210 in lower contact region 230 of FIG. 2E, or the like. Block 918 includes block 922-926.

At block 922, a first silicide shape is formed over the first doped shape. An example of the first silicide shape is top silicide layer 214 of upper contact region 228 of FIG. 2D. From block 922, flow proceeds to block 924.

At block 924, a second MD contact shape is formed over the first silicide shape. An example of the second MD contact shape is MD contact shape 218 of upper contact region 228 of FIG. 2D. From block 924, flow proceeds to block 926.

At block 926, a second VD shape is formed over the second MD contact shape. An example of the second VD shape is VD shape 220 over the upper contact region 228 of FIG. 2B. From block 926, flow exits block 918.

The discussion now returns to block 920. At block 920, a lower contact arrangement is generated. An example of the lower contact arrangement is lower contact region 230 of FIG. 2B, or the like. Block 920 includes blocks 928-930.

At block 928, a second silicide shape is formed under the first doped shape. An example of the second silicide shape is bottom silicide layer 216 of lower contact region 230 of FIG. 2E. From block 928, flow proceeds to block 930.

At block 930, a second BVD shape is formed under the second silicide shape. An example of the second BVD shape is BVD shape 222 of lower contact region 230 of FIG. 2B.

Figure 10:
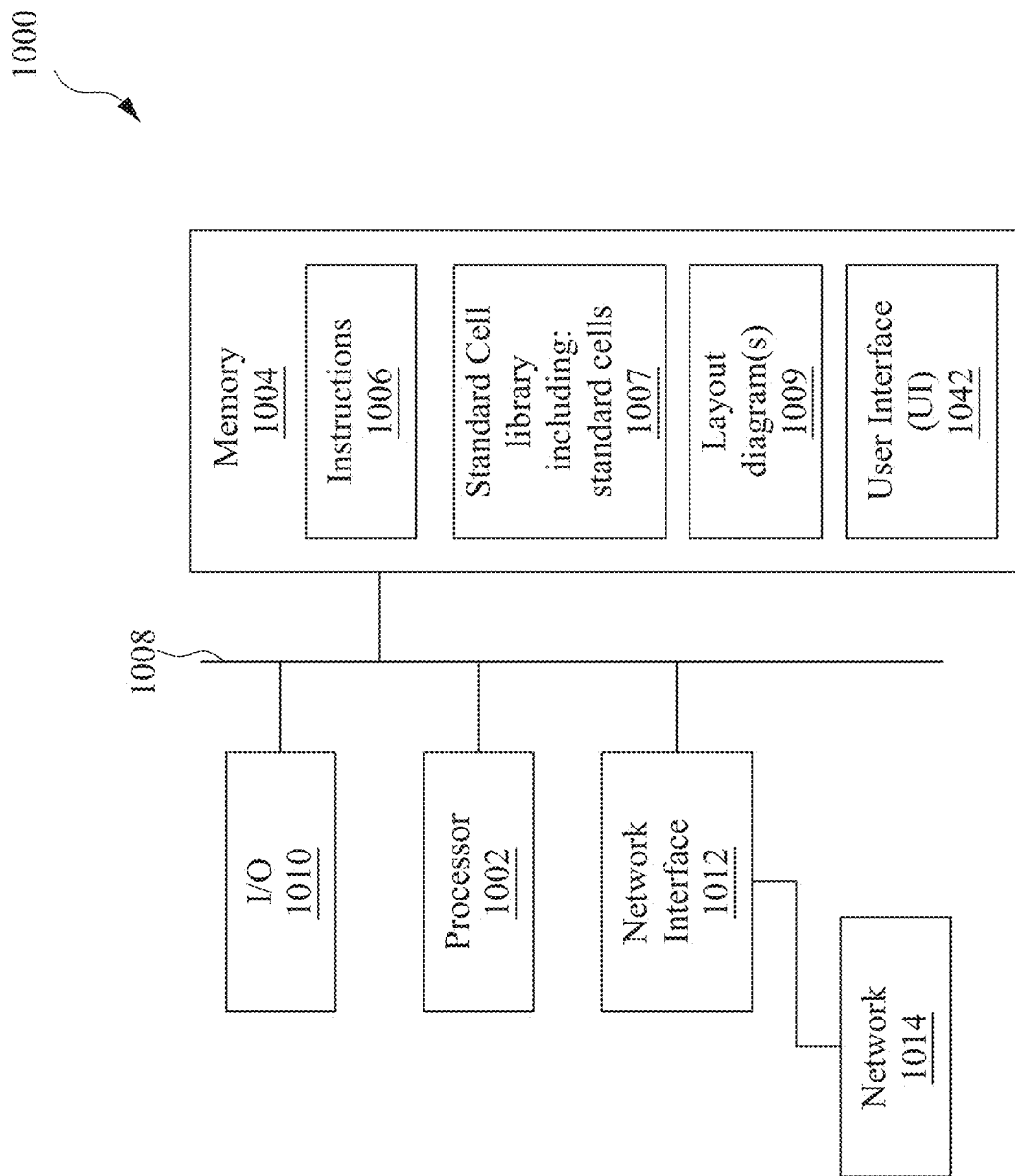
FIG. 10 is a block diagram of an electronic design automation (EDA) system, in accordance with some embodiments.

FIG. 10 is a block diagram of an electronic design automation (EDA) system 1000, in accordance with some embodiments.

In some embodiments, EDA system 1000 includes an automatic routing and placement (APR) system. Methods described herein of designing layout diagrams, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein. In one or more embodiments, storage medium 1004 stores one or more layout diagrams 1009 corresponding to one or more layouts disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
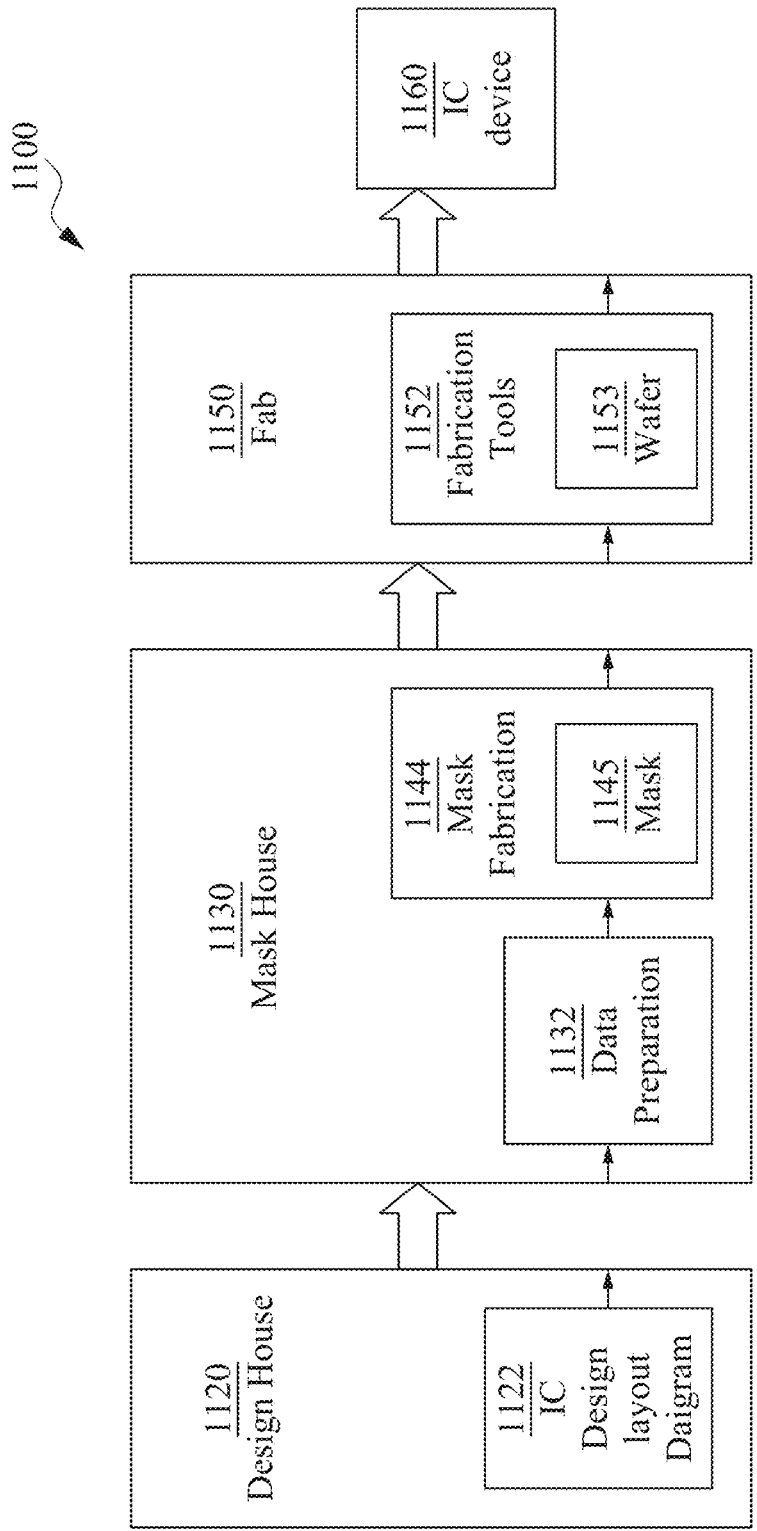
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes: a first arrangement including first and second silicide layers correspondingly electrically coupled to opposing first and second sides of a doped first portion of an active region; and a second arrangement including a third silicide layer electrically coupled to a first or second side of a doped second portion of the active region.

In some embodiments, the first arrangement is a temperature sensor.

In some embodiments, a resistance of the doped first portion of the first arrangement is significantly different than a resistance of the doped second portion of the second arrangement.

In some embodiments, a resistance of the doped first portion changes relatively little with temperature.

In some embodiments, the first arrangement is a heater configured to heat a transistor of which the first arrangement comprises a part.

In some embodiments, a resistance of the doped first portion changes at least significantly with temperature.

In some embodiments, the resistance of the doped first portion changes substantially with temperature.

In some embodiments, the first arrangement is a temperature sensor configured to sense a temperature of a transistor of which the first arrangement comprises a part.

In some embodiments, the doped first portion is thermally proximal to the doped second portion.

In some embodiments, a distance D between the doped first portion and the doped second portion in a range $D \le (\approx 100 \text{ nm})$.

In some embodiments, a semiconductor device includes: a first arrangement including first and second silicide layers correspondingly electrically coupled to opposing first and second sides of a doped first portion of an active region; and a second arrangement including a third silicide layer electrically coupled to a first or second side of a doped second portion of the active region, a resistance of the doped second portion being significantly different than a resistance of the doped first portion.

In some embodiments, the resistance of the doped first portion changes relatively little with temperature.

In some embodiments, the first arrangement is a heater configured to heat a transistor of which the first arrangement comprises a part.

In some embodiments, the resistance of the doped first portion changes at least significantly with temperature.

In some embodiments, the resistance of the doped first portion changes substantially with temperature.

In some embodiments, the first arrangement is a temperature sensor configured to sense a temperature of a transistor of which the first arrangement comprises a part.

In some embodiments, a method (of manufacturing a semiconductor structure) includes: forming an active region having doped first and second portions; forming one or more first-side silicide layers at a first side of the active region including forming a first first-side silicide layer electrically coupled to the doped first portion; forming one or more second-side silicide layers at a second side of the active region including forming a first second-side silicide layer electrically coupled to the doped first portion; and at least one of (A) the forming one or more first-side silicide layers further including forming a second front-side silicide layer electrically coupled to the doped second portion or (B) the forming one or more second-side silicide layers including forming a second second-side silicide layer electrically coupled to the doped second portion.

In some embodiments, the forming an active region includes doping the doped first portion to have a resistance that changes relatively little with temperature.

In some embodiments, the forming an active region includes doping the doped first portion to have a resistance that changes at least significantly with temperature.

In some embodiments, the forming an active region further includes doping the doped first portion so that a resistance of the doped first portion changes substantially with temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first arrangement including first and second silicide layers correspondingly electrically coupled to opposing first and second surfaces of a doped first portion of an active region; and
a second arrangement including a third silicide layer electrically coupled to a first or second surface of a doped second portion of the active region.

2. The device of claim 1, wherein:
the first arrangement is a temperature sensor.

3. The device of claim 1, wherein:
a resistance of the doped first portion of the first arrangement is sufficiently different than a resistance of the doped second portion of the second arrangement such that the doped first portion of the first arrangement is effective as a heater for the doped second portion of the second arrangement.

4. The device of claim 1, wherein:
a resistance of the doped first portion remains substantially uniform with temperature.

5. The device of claim 4, wherein:
the first arrangement is a heater configured to heat a transistor of which the first arrangement comprises a part.

6. The device of claim 1, wherein:
a resistance of the doped first portion changes substantially non-linearly with temperature.

7. The device of claim 6, wherein:
the first arrangement is a temperature sensor configured to sense a temperature of a transistor of which the first arrangement comprises a part.

8. The device of claim 1, wherein:
the doped first portion is thermally proximal to the doped second portion.

9. The device of claim 8, wherein:
a distance D between the doped first portion and the doped second portion in a range D≤(100 nm).

10. The device of claim 1, wherein:
in terms of resistance versus temperature behavior, the doped first portion behaves as a thermistor.

11. A semiconductor device comprising:
a first arrangement including first and second silicide layers correspondingly electrically coupled to opposing first and second surfaces of a doped first portion of an active region; and
a second arrangement including a third silicide layer electrically coupled to a first or second surface of a doped second portion of the active region,
   a resistance of the doped second portion being sufficiently different than a resistance of the doped first portion such that the doped first portion of the first arrangement is effective as a heater for the doped second portion of the second arrangement.

12. The device of claim 11, wherein:
the resistance of the doped first portion remains substantially uniform with temperature.

13. The device of claim 12, wherein:
the first arrangement is a heater configured to heat a transistor of which the first arrangement comprises a part.

14. The device of claim 11, wherein:
the resistance of the doped first portion changes substantially non-linearly with temperature.

15. The device of claim 14, wherein:
the first arrangement is a temperature sensor configured to sense a temperature of a transistor of which the first arrangement comprises a part.

16. The device of claim 11, wherein:
in terms of resistance versus temperature behavior, the doped first portion behaves as a thermistor.

17. A method of manufacturing a semiconductor structure, the method comprising:
forming an active region having doped first and second portions;
forming one or more first-side silicide layers at a first surface of the active region including:
   forming a first first-side silicide layer electrically coupled to the doped first portion;
forming one or more second-side silicide layers at a second surface of the active region including:
   forming a first second-side silicide layer electrically coupled to the doped first portion; and
at least one the following:
   the forming one or more first-side silicide layers further including forming a second front-side silicide layer electrically coupled to the doped second portion; or
   the forming one or more second-side silicide layers including forming a second second-side silicide layer electrically coupled to the doped second portion.

18. The method of claim 17, wherein:
the forming an active region includes:
   doping the doped first portion to have a resistance that remains substantially uniform with temperature.

19. The method of claim 17, wherein:
the forming an active region includes:
   doping the doped first portion to have a resistance that changes substantially non-linearly with temperature.

20. The method of claim 17, wherein:
the forming an active region includes:
   in terms of resistance versus temperature behavior, doping the doped first portion so that the doped first portion behaves as a thermistor.

* * * * *